US010071419B2

United States Patent
Tomonari et al.

(10) Patent No.: US 10,071,419 B2
(45) Date of Patent: Sep. 11, 2018

(54) METALLIC COPPER DISPERSION, PROCESS FOR PRODUCING THE METALLIC COPPER DISPERSION, ELECTRODE, WIRING PATTERN, AND COATING FILM FORMED USING THE METALLIC COPPER DISPERSION, DECORATIVE ARTICLE AND ANTIMICROBIAL ARTICLE WITH THE COATING FILM FORMED THEREON, AND PROCESSES FOR PRODUCING THE DECORATIVE ARTICLE AND THE ANTIMICROBIAL ARTICLE

(75) Inventors: Masanori Tomonari, Yokkaichi (JP); Kiyonobu Ida, Yokkaichi (JP)

(73) Assignee: ISHIHARA SANGYO KAISHA, LTD., Osaka-Shi, Osaka (JP)

(*) Notice: Subject to any disclaimer, the term of this patent is extended or adjusted under 35 U.S.C. 154(b) by 373 days.

(21) Appl. No.: 13/060,898

(22) PCT Filed: Aug. 28, 2009

(86) PCT No.: PCT/JP2009/065073
§ 371 (c)(1),
(2), (4) Date: Feb. 25, 2011

(87) PCT Pub. No.: WO2010/024385
PCT Pub. Date: Mar. 4, 2010

(65) Prior Publication Data
US 2011/0155432 A1    Jun. 30, 2011

(30) Foreign Application Priority Data
Aug. 29, 2008    (JP) .................................. 2008-222557

(51) Int. Cl.
*H05K 1/09*    (2006.01)
*B22F 1/00*    (2006.01)
(Continued)

(52) U.S. Cl.
CPC .......... *B22F 1/0022* (2013.01); *B22F 1/0062* (2013.01); *B22F 1/02* (2013.01);
(Continued)

(58) Field of Classification Search
CPC .. B22F 1/0062; B22F 2201/03; C09D 7/1225; H05K 1/097; H05K 3/12
See application file for complete search history.

(56) References Cited

U.S. PATENT DOCUMENTS 5,240,640 A * 8/1993 Siiman et al. ................. 516/101
7,828,872 B2 * 11/2010 Tomonari et al. .............. 75/343
(Continued)

FOREIGN PATENT DOCUMENTS

JP    61019784 A  *  1/1986    ............. C23C 18/40
JP    61-055562 B     11/1986
(Continued)

OTHER PUBLICATIONS

Yonezawa et al., The preparation of copper fine particle paste and its application as the inner layer electrode material of a multilayered ceramic capacitor, Mar. 5, 2008, Nanotechnology 19 (2008) 145706, pp. 1-5.*

*Primary Examiner* — Elizabeth A Robinson
(74) *Attorney, Agent, or Firm* — Jeffrey S. Melcher; Manelli Selter PLLC

(57) ABSTRACT

A dispersion comprising at least metallic copper particles with gelatin provided on the surface thereof, a polymeric dispersant, and an organic solvent. The dispersion is produced by reducing copper oxide in an aqueous solvent in the presence of gelatin having an amine number and an acid number wherein the difference (amine number–acid number) is 0 or less, then subjecting the reaction solution to solid-liquid separation, and then mixing the resultant metallic copper particles with gelatin provided on the surface
(Continued)

thereof and a polymeric dispersant having an amine number and an acid number wherein the difference (amine number–acid number) is 0 to 50, into an organic solvent. The dispersion maintains dispersion stability of the metallic copper particles for a long time, is suitable for inkjet printing and spray coating and can be used to make microelectrodes and circuit wiring patterns.

23 Claims, 2 Drawing Sheets

(51) Int. Cl.
| | |
|---|---|
| B22F 1/02 | (2006.01) |
| B82Y 30/00 | (2011.01) |
| C09D 5/16 | (2006.01) |
| C09D 11/50 | (2014.01) |
| C09D 17/00 | (2006.01) |
| H01B 1/22 | (2006.01) |
| B22F 9/24 | (2006.01) |
| C09D 7/62 | (2018.01) |
| C09D 7/40 | (2018.01) |
| C08K 3/08 | (2006.01) |
| C08K 9/08 | (2006.01) |

(52) U.S. Cl.
CPC ............... *B22F 9/24* (2013.01); *B82Y 30/00* (2013.01); *C09D 5/1618* (2013.01); *C09D 7/62* (2018.01); *C09D 7/67* (2018.01); *C09D 11/50* (2013.01); *C09D 17/006* (2013.01); *H01B 1/22* (2013.01); *H05K 1/097* (2013.01); *C08K 3/08* (2013.01); *C08K 9/08* (2013.01)

(56) References Cited

U.S. PATENT DOCUMENTS

| | | | |
|---|---|---|---|
| 2005/0129383 A1* | 6/2005 | Renn et al. | 385/147 |
| 2006/0057363 A1* | 3/2006 | Takahashi et al. | 428/323 |
| 2006/0210705 A1* | 9/2006 | Itoh | H01B 1/22 |
| | | | 427/96.1 |

FOREIGN PATENT DOCUMENTS

| | | | |
|---|---|---|---|
| JP | 03224288 A | * | 10/1991 |
| JP | 2004-346429 A | | 12/2004 |
| JP | 2007-138092 A | | 6/2007 |
| TW | 200609064 | | 3/2006 |
| WO | WO 2006/019144 | | 2/2006 |
| WO | WO 2007/013393 | | 2/2007 |

\* cited by examiner

METALLIC COPPER DISPERSION, PROCESS FOR PRODUCING THE METALLIC COPPER DISPERSION, ELECTRODE, WIRING PATTERN, AND COATING FILM FORMED USING THE METALLIC COPPER DISPERSION, DECORATIVE ARTICLE AND ANTIMICROBIAL ARTICLE WITH THE COATING FILM FORMED THEREON, AND PROCESSES FOR PRODUCING THE DECORATIVE ARTICLE AND THE ANTIMICROBIAL ARTICLE

This application is the national phase of international application PCT/JP2009/065073 filed 28 Aug. 2009, which designated the U.S.

TECHNICAL FIELD

The present invention relates to a metallic copper dispersion in which metallic copper particles are blended, a process for producing the metallic copper dispersion, and an electrode, a wiring pattern, and a coating film formed using the metallic copper dispersion. The present invention further relates to a decorative article and an antimicrobial article with the coating film formed thereon, and a process for producing a metallic copper-containing film used for the decorative article and the antimicrobial article.

BACKGROUND ART

A dispersion in which metallic copper particles are blended is a general term usually including compositions such as coating agents, paints, pastes, and inks in which metallic copper particles are dispersed in a solvent and additives such as a binder, a dispersing agent, a viscosity controlling agent are further blended when necessary. Such a dispersion is used for various applications, for example, in order to ensure electrical conduction, or in order to give antistatic properties, electromagnetic interference shielding properties, metallic luster, and antibacterial properties, by making use of properties of the metallic copper particles. In addition, in recent years, metallic copper particles whose average particle size is approximately 1 to 200 nm have been used as the metallic copper particles to be blended, so that the application is enlarged in many fields. Specifically, by making use of high conductivity of the metallic copper particles, the metallic copper particles are used to shield transparent members such as cathode ray tubes and liquid crystal displays from electromagnetic interference. Moreover, a technique for forming a fine electrode and a circuit wiring pattern by using metallic copper particles that are a nano material is proposed. This is a technique for applying a dispersion having blended metallic copper particles on a substrate by a coating method such as screen printing and ink jet printing to form a pattern of an electrode or a circuit wiring, and subsequently heating the applied dispersion at a relatively low temperature so that the metallic copper particles are fused. Particularly, this technique is gradually applied to production of a printed circuit board. Further, a simple technique for producing a mirror finished surface attracts attention in design and decoration application because fusing of metallic copper particles easily progresses and metallic luster appears itself even under a mild heating condition.

As metallic copper particles and a dispersion in which the metallic copper particles are dispersed, for example, Patent Literature 1 discloses production of metallic copper particulates by mixing divalent copper oxide with a reducing agent in a medium in the presence of a complexing agent and a protective colloid to reduce the divalent copper oxide, and production of a fluid composition by dispersing the obtained metallic copper particulates in a dispersion medium. Patent Literature 1 describes use of a water-based solvent, a hydrophilic organic solvent, a hydrophobic organic solvent, and the like as the dispersion medium. Patent Literature 2 describes production of a copper colloidal solution containing copper colloidal particles and a polymer pigment dispersing agent by dissolving a copper compound in a solvent, adding the polymer dispersing agent for pigment, and subsequently performing a reduction, and use of a polymer of a comb shaped structure having a pigment-affinitive group in the main chain and/or a plurality of side chains and having a plurality of side chains that form solvated portions as the polymer pigment dispersing agent, and the like.

CITATION LIST

Patent Literatures

Patent Literature 1: WO2006/019144
Patent Literature 2: JP 2004-346429 A

SUMMARY OF INVENTION

Technical Problem

The metallic copper particulates described in Patent Literature 1 have high dispersion stability, and can be heat molten at a relatively low temperature. For this reason, the metallic copper particulates are suitably used for various applications such as ensuring electrical conduction and giving antistatic properties, electromagnetic interference shielding properties, metallic luster, and antibacterial properties. On the other hand, in order to improve printability of ink jet printing and coating suitability of spray coating and the like, a dispersion having high dispersion stability for a long period of time is desired. In Patent Literature 2, 50 to 1000 parts by weight of the polymer pigment dispersing agent to be used is necessary based on 100 parts by weight of copper. According to Patent Literature 2, at an amount of less than 50 parts by weight, dispersibility of the copper colloidal particles is insufficient. A dispersion having high dispersion stability for a long period of time even by use of a smaller amount of a dispersing agent is desired.

Further, in the case where the metallic copper dispersion is applied by ink jet printing or the like, those having lower viscosity are demanded in order to prevent a nozzle from being blocked.

Solution to Problem

As a result of repeated extensive research in order to solve the above-mentioned problems, the present inventors thought that both a protective colloid at the time of producing metallic copper particles in a water-based solvent and a dispersing agent at the time of dispersing the metallic copper particles in an organic solvent are necessary in the process for producing metallic copper particles described in Patent Literature 1. As a result of repeated examination in various ways, the present inventors found out that by using a gelatin having a specific difference between an amine value and an acid value as the protective colloid, producing metallic copper particles having the gelatin on the surface thereof, and using a specific polymer dispersing agent such that the difference between the amine value and the acid value of the gelatin is compensated when the metallic copper particles are dispersed in an organic solvent, the polymer dispersing agent neutralizes charges of the gelatin existing on the surface of the metallic copper particles so that a metallic copper dispersion having higher dispersion stability is obtained. Thus, the present invention has been completed. Moreover, a simple process for producing a metallic copper-containing film having a good metal tone and low resistance by using the metallic copper dispersion according to the present invention has also been devised.

Namely, the present invention is (1) a metallic copper dispersion containing at least metallic copper particles having a gelatin on a surface thereof, a polymer dispersing agent, and an organic solvent, wherein a difference between an amine value and an acid value (amine value–acid value) of the gelatin is not more than 0, and a difference between an amine value and an acid value (amine value–acid value) of the polymer dispersing agent is 0 to 50 (0 and 50 are inclusive, and this is the same below); and (2) a process for producing a metallic copper dispersion, comprising: reducing copper oxide in a water-based solvent in the presence of a gelatin, performing solid-liquid separation to obtain metallic copper particles, then, mixing the obtained metallic copper particles having the gelatin on the surface thereof with a polymer dispersing agent in an organic solvent to disperse the metallic copper particles, wherein a gelatin having a difference between an amine value and an acid value (amine value–acid value) of not more than 0 is used as the gelatin, and a polymer dispersing agent having a difference between an amine value and an acid value (amine value–acid value) of 0 to 50 is used as the polymer dispersing agent; (3) an electrode, a wiring pattern, or a coating film formed by using the metallic copper dispersion according the above (1) and (2); (4) a decorative article and an antimicrobial article on which the coating film according to (3) is formed; and (5) a process for producing a metallic copper-containing film used for an electrode and a wiring pattern according to (3) or a design and decoration coating film and the like according to (4).

Advantageous Effects of Invention

The metallic copper dispersion according to the present invention can maintain dispersion stability of the metallic copper particles in the organic solvent for a long period of time. For this reason, the metallic copper dispersion is suitable for industrial use because dispersion stability is maintained until the metallic copper dispersion is used after it is prepared. The metallic copper dispersion have high printability and coating suitability, and can be used in a wide range of coating methods such as ink jet printing and spray coating. According to the purpose of use, a composition such as paints, inks, and pastes can be arbitrarily designed by blending a resin component or the like.

In the metallic copper dispersion according to the present invention, the amount of the polymer dispersing agent to be used can be relatively small, so that the metallic copper particles can be fused by heating at a relatively low temperature.

In the metallic copper dispersion according to the present invention, a viscosity of the dispersion can be adjusted to be relatively low even at a high concentration of the metallic copper particles, and therefore, the metallic copper dispersion is suitable for ink jet printing, spray coating, and the like.

Further, a metallic copper-containing film having a high electrical conductivity and a good metal tone can be simply produced by applying the metallic copper dispersion according to the present invention onto the surface of a base material, or by heating or irradiating with a laser beam after the metallic copper dispersion is applied.

Thus, the metallic copper dispersion according to the present invention is used for materials in which electrical conduction is ensured, and materials to which antistatic properties, electromagnetic interference shielding properties, metallic luster, antibacterial properties, or the like is given, for example. Particularly, the metallic copper dispersion according to the present invention is used for formation of a fine electrode and a circuit wiring pattern such as a printed circuit board by making use of conductivity of the metallic copper-containing film, and for design and decoration application by making use of the metal tone of the metallic copper-containing film.

DESCRIPTION OF EMBODIMENTS

Figure 1:
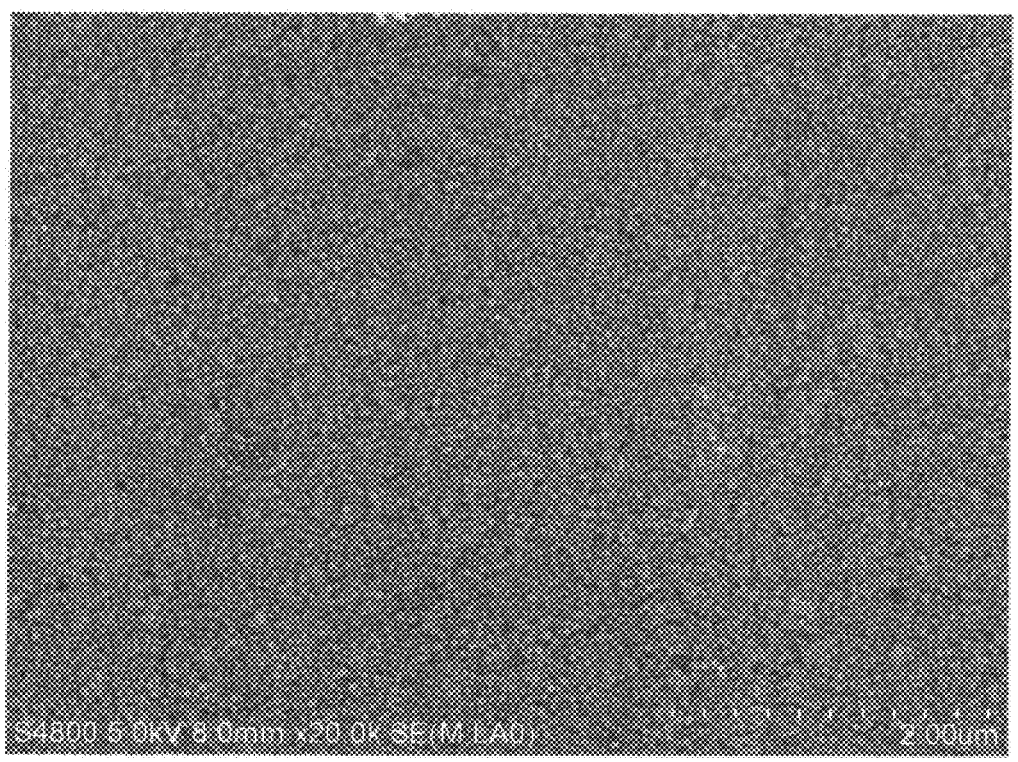
FIG. 1 is an SEM image of the surface of a copper coating film before Sample 1 of Example 23 is irradiated with a laser.

The present invention is a dispersion in which metallic copper particles are dispersed in an organic solvent. The dispersion includes at least metallic copper particles having a gelatin on the surface thereof, a polymer dispersing agent, and an organic solvent. The dispersion includes compositions usually called dispersing bodies, coating agents, paints, pastes, inks and the like. The metallic copper particles used in the present invention have a gelatin mentioned below on the surface thereof. The particle size of the metallic copper particles, components other than copper, and the like are not particularly limited, and can be properly selected according to application. With respect to the particle size of the metallic copper particles, preferably, metallic copper particles having the average particle size of approximately 1 nm to 10 µm are used properly for availability. The metallic copper particles having the average particle size of approximately 1 nm to 1 µm are more preferable. The metallic copper particles having the average particle size of approximately 1 to 200 nm are still more preferable because those can be used in various application. In order to obtain a finer electrode and circuit wiring pattern, the metallic copper particles having the average particle size in the range of 5 to 50 nm are still more preferably used. The metallic copper particles may contain impurities inevitable on the production process such as oxygen and dissimilar metal copper, or may contain oxygen, metal oxide, and organic compounds such as a complexing agent in advance when necessary in order to prevent rapid oxidation of the metallic copper particles.

The gelatin existing on the surface of the metallic copper particles has a difference between an amine value and an acid value, i.e., (amine value–acid value) of not more than 0. The difference therebetween is more preferably in the range of –50 to 0. The gelatin is usually an animal protein having collagen as a parental material. In a process of producing the gelatin, a raw material is pretreated using an inorganic acid such as hydrochloric acid and sulfuric acid, or lime in order to efficiently extract a gelatin of high quality from the raw material such as cow bone, oxhide, and pig skin. The one pretreated by an inorganic acid is called an acid-treated gelatin, and the one pretreated by lime is called an alkali-treated (or lime-treated) gelatin. During a step of extracting the gelatin, acid amide in collagen is hydrolyzed to release ammonia to be changed to a carboxyl group. For this reason, the isoionic point of the gelatin is reduced. Particularly, the alkali-treated gelatin is deamidated nearly 100% at a liming step. For this reason, the isoionic point of the alkali-treated gelatin is in an acidic region, and is approximately pH of 5. In contrast to this, in the case of the acid-treated gelatin, a duration of treatment of the raw material is short, and a deamidation rate is low. For this reason, the acid-treated gelatin has an isoionic point in an alkaline region, and the pH thereof is approximately 8 to 9, which is close to that of collagen. From these, the gelatin has an amine value because the gelatin has a basic group and a hydroxy group, and has an acid value because the gelatin has an acidic group. In the present invention, the gelatin existing on the surface of the metallic copper particles is preferably an alkali-treated gelatin. The difference between the amine value and the acid value measured by the method mentioned below, i.e., (amine value–acid value), is not more than 0, and is more preferably in the range of –50 to 0. Compared with the acid-treated gelatin, the alkali-treated gelatin has a high effect as a protective colloid on the metallic copper particles, and is preferable.

In the present invention, a specific gelatin exists on the surface of the metallic copper particles. The gelatin is dissociated in a solvent because of its high acid value. Accordingly, the metallic copper particles including the gelatin have electrically negative, charge and floculate easily in an organic solvent. For that reason, the polymer dispersing agent is mixed in order to neutralize an acid site leading to the acid value of the gelatin. Similarly to the gelatin, the polymer dispersing agent also has an amine value and an acid value because the polymer dispersing agent has a hydroxy group, an acidic group, a basic group, and the like. As mentioned above, the difference between the amine value and the acid value that the gelatin has, i.e., (amine value–acid value) is not more than 0. Accordingly, it is necessary to use the polymer dispersing agent having an amine value (base site) and an acid value (acid site) at a degree in which the acid value (acid site) and amine value (base site) that the gelatin has are compensated (neutralized) or more than that. It is important that the difference between the amine value and the acid value, i.e., (amine value–acid value) is 0 to 50, and more preferably in the range of 1 to 30. The polymer dispersing agent may be electrostatically bonded to the acid site and the base site of the gelatin through the base site and acid site thereof. From these, it is thought that a value of (amine value that polymer dispersing agent has x weight of polymer dispersing agent)–(acid value that gelatin has x weight of gelatin) is preferably not less than 0.

The amine values of the gelatin and the polymer dispersing agent denote the total amount of free bases and bases, and expressed by an equivalent amount of potassium hydroxide in mg based on hydrochloric acid needed to neutralize 1 g of a sample. The acid value denotes the total amount of free fatty acids and fatty acids, and expressed by an amount of potassium hydroxide in mg needed to neutralize 1 g of a sample. Specifically, the amine value and the acid value are measured by the method according to JIS K 7700 or ASTM D2074 below.

(Method for Measuring Amine Value)

5 g of the gelatin or the polymer dispersing agent and several drops of a bromocresol green ethanol solution are dissolved in a mixed solvent of 300 mL of ethanol and pure water. A 0.1 M HCl ethanol solution whose factor (correction coefficient) is calculated is added to the mixed solution, and the amine value is calculated from the titer of the 0.1 M HCl ethanol solution when yellow of a bromocresol green indicator continues for 30 seconds.

(Method for Measuring Acid Value)

5 g of the gelatin or the polymer dispersing agent and several drops of a phenolphthalein solution are dissolved in 300 mL of pure water, and a 0.1 M KOH ethanol solution whose factor (correction coefficient) is calculated is added to the mixed solution. The acid value is calculated from the titer of the 0.1 M KOH ethanol solution when light red of a phenolphthalein indicator continues for 30 seconds.

Any polymer dispersing agent can be used as long as an (amine value–acid value) of the polymer dispersing agent is 0 to 50. For example, the polymer dispersing agent is polymers and copolymers having a tertiary amino group, quaternary ammonium, a heterocyclic group having a basic nitrogen atom, or a basic group such as a hydroxyl group. The polymer dispersing agent may have an acidic group such as a carboxyl group. For that reason, the amine value and acid value that the polymer dispersing agent has are compensated so that (amine value–acid value) may be 0. The polymer dispersing agent having an amine value higher than the acid value is preferable, and (amine value–acid value) is preferably in the range of 1 to 30. The basic group or acidic group of the polymer dispersing agent is a functional group affinitive to the metal copper particles covered with the gelatin. For this reason, the polymer dispersing agent having not less than one basic group or acidic group in the main chain and/or the side chain of the polymer is preferable, and the polymer dispersing agent having not less than two basic groups or acidic groups in the main chain and/or the side chain of the polymer is more preferable. The basic group and the acidic group may be included at one terminal of the main chain of the polymer and/or one terminal of the side chain thereof. Linear polymers such as A-B block-type polymers and polymers having a comb-shaped structure with a plurality of side chains can be used for the polymer dispersing agent. The weight average molecular weight of the polymer dispersing agent is not limited, and the weight average molecular weight thereof measured by a gel permeation chromatography method is preferably in the range of 2,000 to 1,000,000. Dispersion stability is not sufficient at a weight average molecular weight less than 2,000. At a weight average molecular weight more than 1,000,000, viscosity is too high, and handling is likely to be difficult. The weight average molecular weight of the polymer dispersing agent is more preferably in the range of 4,000 to 1,000,000, and still more preferably in the range of 10,000 to 1,000,000. Moreover, the polymer dispersing agent containing a smaller amount of elements of phosphorus, sodium, and potassium is preferable, and the polymer dispersing agent containing no elements of phosphorus, sodium, and potassium is more preferable. In the case where the polymer dispersing agent contains elements of phosphorus, sodium, and potassium, it is not preferable because the elements remain as ash when an electrode, a wiring pattern, and the like are produced by heating and burning. One or more of such polymer dispersing agents can be selected properly, and used.

Specifically, examples of the polymer dispersing agent include polymers having a basic group such as a salt of a long-chain polyaminoamide and polar acid ester, unsaturated polycarboxylic acid polyaminoamide, a polycarboxylic acid salt of polyaminoamide, and a salt of a long-chain polyaminoamide and an acid polymer. Examples thereof also include alkyl ammonium salts, amine salts, and amide amine salts of polymers such as acrylic polymers, acrylic copolymers, modified polyester acids, polyether ester acids, polyether carboxylic acids, and polycarboxylic acids. Commercially available polymer dispersing agents can also be used as such a polymer dispersing agent. Examples of the above commercial products can include DISPERBYK (registered trademark)-112, DISPERBYK-130, DISPERBYK-140, DISPERBYK-160, DISPERBYK-161, DISPERBYK-162, DISPERBYK-163, DISPERBYK-2155, DISPERBYK-2163, DISPERBYK-2164, DISPERBYK-180, DISPERBYK-2000, DISPERBYK-2163, DISPERBYK-2164, BYK (registered trademark) 9076, and BYK 9077 (made by BYK-Chemie GmbH); FLOWLEN DOPA-15B, FLOWLEN DOPA-15BHFS, FLOWLEN DOPA-22, FLOWLEN DOPA-33, FLOWLEN DOPA-44, FLOWLEN DOPA-17HF, FLOWLEN TG-662C, and FLOWLEN KTG-2400 (made by Kyoeisha Chemical Co., Ltd.); and ED-117, ED-118, ED-212, ED-213, ED-214, ED-216 (made by Kusumoto Chemicals, Ltd.).

An organic solvent can be selected properly. Specifically, at least one selected from hydrocarbon solvents such as toluene, xylene, solvent naphtha, normal hexane, isohexane, cyclohexane, methylcyclohexane, normal heptane, tridecane, tetradecane, and pentadecane; alcoholic solvents such as methanol, ethanol, butanol, IPA (isopropyl alcohol), normal propyl alcohol, 2-butanol, TBA (tertiary butanol), butanediol, ethylhexanol, and benzyl alcohol; ketone solvents such as acetone, methyl ethyl ketone, methyl isobutyl ketone, DIBK (diisobutyl ketone), cyclohexanone, and DAA (diacetone alcohol); ester solvents such as ethyl acetate, butyl acetate, methoxybutyl acetate, cellosolve acetate, amyl acetate, normal propyl acetate, isopropyl acetate, methyl lactate, ethyl lactate, and butyl lactate; ether solvents such as methyl cellosolve, cellosolve, butyl cellosolve, dioxane, MTBE (methyl tertiary butyl ether), and butyl carbitol; glycol solvents such as ethylene glycol, diethylene glycol, triethylene glycol, and propylene glycol; glycol ether solvents such as diethylene glycol monomethyl ether, triethylene glycol monomethyl ether, propylene glycol monomethyl ether, and 3-methoxy-3-methyl-1-butanol; glycol ester solvents, such as ethylene glycol monomethyl ether acetate, PMA (propylene glycol monomethylether acetate), diethylene glycol monobutyl ether acetate, and diethylene glycol monoethyl ether acetate can be used for the organic solvent. The organic solvent having low viscosity is preferable in order to adapt to reduction in viscosity of the metallic copper dispersion, and those having a viscosity in the range of 1 to 20 mPa·s are preferable. As such an organic solvent, toluene, butyl carbitol, butanol, propyleneglycol-1-monomethylether-2-acetate, butyl cellosolve, tetradecane, and the like are suitably used.

The amount of the gelatin in the range of approximately 0.1 to 15 parts by weight based on 100 parts by weight of the metallic copper particles is preferable in order to be desired effect is obtained. The range of approximately 0.1 to 10 parts by weight is more preferable. The amount of the polymer dispersing agent in the range of 0.1 to 20 parts by weight based on 100 parts by weight of the metallic copper particles is preferable in order to be desired effect is obtained. An amount of the polymer dispersing agent excessively smaller than that in the range is not preferable because the effect of the present invention is hard to be obtained. An amount of the polymer dispersing agent excessively larger than that in the range is not preferable because conductivity may be obstructed in application to an electrode material, and cloudiness or the like may occur to deteriorate an appearance in application to a decorative article. The range of 0.1 to 10 parts by weight is more preferable. Particles only partially coated with a colloid and particles not coated with a colloid may be present in the range in which the effect of the present invention is not obstructed. The concentration of the metallic copper particles in the dispersion can be adjusted properly. Specifically, the concentration of the metallic copper particles can be adjusted at not less than 10% by weight, preferably 10 to 80% by weight, and more preferably approximately 20 to 70% by weight.

In the metallic copper dispersion according to the present invention, the metallic copper particles are sufficiently dispersed. For this reason, even if the metallic copper particles are in a high concentration, viscosity of the dispersion can be adjusted to be relatively low. For example, viscosity of the dispersion can be preferably not more than 100 mPa·s, more preferably 1 to 30 mPa·s, and still more preferably 1 to 20 mPa·s. When the concentration of the metallic copper particles in the dispersion is increased, viscosity of the dispersion is easily increased. The dispersion according to the present invention, however, can maintain the viscosity even when the concentration of the metallic copper particles is not less than 15% by weight. The dispersion according to the present invention has low viscosity and a high concentration as mentioned above, and can be used suitably for ink jet printing, spray coating, and the like. While the median size (accumulation median size, 50% particle size) obtained by measuring the metallic copper particles dispersed in the dispersion according to the present invention by a dynamic light scattering particle size distribution analyzer depends on the size of the metallic copper particles to be used, the median size is preferably not more than 1.0 μm, more preferably approximately 1 to 200 nm, and still more preferably approximately 1 to 100 nm. From these, as a preferable aspect of the metallic copper dispersion according to the present invention, the concentration of the metallic copper particles is not less than 15% by weight, the median size of the metallic copper particles is 1 to 200 nm, and viscosity of the dispersion is not more than 100 mPa·s.

Other than the metallic copper particles, the organic solvent, and the polymer dispersing agent, a curable resin, a thickener, a plasticizer, an antifungal agent, a surface active agent, a non-surface active type dispersing agent, a surface control agent (leveling agent), and the like can also be properly blended with the metallic copper dispersion according to the present invention when necessary. The curable resin can further improve adhesion of a coating product to a base material. As the curable resin, resins of a dissolved type in a low-polar non-water-based solvent, an emulsion type, a colloidal dispersion type can be used without limitation. As a resin kind of the curable resin, known protein based polymers, acrylic resins, polyester resins, urethane resins, cellulose, and the like can be used without limitation. The blending amount of the curable resin component is preferably not more than 10 parts by weight based on 100 parts by weight of the metallic copper particles. A more preferable range thereof is not more than 8 parts by weight, and not more than 5 parts by weight is still more preferable. As the surface active agent, cationic surface active agents are preferable. These are a compound having surface activity in a portion that dissociates in a water-based solvent to show electrical positivity. Examples thereof include (1) quarternary ammonium salts ((a) aliphatic quarternary ammonium salts (e.g., $[RN(CH_3)_3]^+X^-$, $[RR'N(CH_3)_2]^+X^-$, [RR'R"N $(CH_3)]^+X^-$, $[RR'R''R''']^+X^-$: wherein R, R', R", R''' represent a same or different alkyl group; X represents a halogen atom such as Cl, Br, and I; hereinafter, as defined above); (b) aromatic quarternary ammonium salts (e.g., $[R_3N(CH_2Ar)]^+X^-$, $[RR'N(CH_2Ar)_2]^+X^-$: wherein Ar represents an aryl group); and (c) heterocyclic quarternary ammonium salts (e.g., a pyridinium salt ($[C_6H_5N-R]^+X^-$), an imidazolinium salt ($[R-CN(CNR'R'')C_2H_4]^+X$)); and (2) alkylamine salts (e.g., $RH_2NY$, $RR'HNY$, $RR'R''NY$: wherein Y represents an organic acid, an inorganic acid, or the like). One of these may be used, or two or more thereof may be used. Specifically, examples of the aliphatic quarternary ammonium salts include octyltrimethylammonium chloride, stearyltrimethylammonium chloride, cetyltrimethylammonium chloride, cetyltrimethylammonium bromide, lauryltrimethylammonium chloride, dioctyldimethylannmonium chloride, distearyldimethylammonium chloride, trioctylmethylammonium chloride, tristeallylmethylammonium chloride, and tetraoctylammonium chloride. Examples of the aromatic quarternary ammonium salts include decyldimethylbenzylammonium chloride, lauryldimethylbenzylammonium chloride, stearyldimethylbenzylammonium chloride, and benzethonium chloride. Examples of the heterocyclic quarternary ammonium salts include cetylpyridinium chloride and alkylisoquinolinium bromide. Example of the alkylamine salt include neutralized products of octyl amine, decyl amine, lauryl amine, stearyl amine, coconut oil amine, dioctyl amine, distearyl amine, trioctylamine, tristearyl amine, and dioctylmethyl amine neutralized with an inorganic acid such as hydrochloric acid, nitric acid, and sulfuric acid, or a carboxylic acid such as acetic acid. Alternatively, a neutralized product obtained by reacting a mercaptocarboxylic acid on the surface of the metallic copper particles and/or a salt thereof with alkylamine may be used as the alkylamine salt. Of the quarternary ammonium salts, those having at least one alkyl group with not less than 8 carbon atoms or benzyl group are particularly preferable. Examples of such quarternary ammonium salts include stearyltrimethylammonium chloride (carbon atoms of the alkyl group: 18), octyltrimethylammonium chloride (carbon atoms of the alkyl group: 8), lauryltrimethylammonium chloride (carbon atoms of the alkyl group: 12), cetyltrimethylammonium chloride (carbon atoms of the alkyl group: 16), cetyltrimethylammonium bromide (carbon atoms of the alkyl group: 16), tetraoctylammonium bromide (carbon atoms of the alkyl group: 8), dimethyltetradecylbenzylammonium chloride (carbon atoms of the alkyl group: 14), distearyldimethylbenzylammonium chloride (carbon atoms of the alkyl group: 18), stearyldimethylbenzylammonium chloride (carbon atoms of the alkyl group: 18), and benzalkonium chloride (carbon atoms of the alkyl group: 12 to 18). Moreover, of the alkylamines of the alkylamine salts, those having at least one alkyl group with not less than 8 carbon atoms are preferable. Examples of such alkylamines include octyl amine (carbon atoms of the alkyl group: 8), lauryl amine (carbon atoms of the alkyl group: 12), stearyl amine (carbon atoms of the alkyl group: 18), dioctyl amine (carbon atoms of the alkyl group: 8), dilauryl amine (carbon atoms of the alkyl group: 12), distearyl amine (carbon atoms of the alkyl group: 18), trioctyl amine (carbon atoms of the alkyl group: 8), and trilauryl amine (carbon atoms of the alkyl group: 12). The surface control agent controls surface tension of an organic solvent dispersion to prevent defects such as cissing and craters. Examples thereof include acrylic surface control agents, vinyl surface control agents, silicone surface control agents, and fluorine surface control agents. The amount of the surface active agent to be added and that of the surface control agent to be added can be adjusted properly. For example, the amount is preferably not more than 2.0 parts by weight based on 100 parts by weight of the metallic copper particles, and more preferably not more than 0.2 parts by weight.

Next, the present invention is a process for producing a metallic copper dispersion, comprising: reducing copper oxide in a water-based solvent in the presence of a gelatin, then, performing solid-liquid separation, and next, mixing the obtained metallic copper particles having the gelatin on the surface thereof with a polymer dispersing agent in an organic solvent to disperse the metallic copper particles, wherein a gelatin having a difference between an amine value and an acid value (amine value–acid value) of not more than 0 is used as the gelatin, and a polymer dispersing agent having a difference between an amine value and an acid value (amine value–acid value) of 0 to 50 is used as the polymer dispersing agent.

First, a gelatin having a difference between an amine value and an acid value (amine value–acid value) of not more than 0 is used as a protective colloid. In the presence of the gelatin, copper oxide and a reducing agent are mixed in a water-based solvent to perform reduction. Then, metallic copper particles having the gelatin on the surface thereof are produced. By use of the gelatin, the gelatin exists on the surface of the produced metallic copper particles so that the metallic copper particles having a small amount of aggregates in the water-based solvent and having good dispersibility can be produced. The amount of the gelatin to be used is preferably in the range of 1 to 100 parts by weight based on 100 parts by weight of the copper oxide because dispersion of the produced copper particles is easily stabilized, more preferably the range of 2 to 50 parts by weight, and still more preferably 3 to 15 parts by weight. Divalent copper oxide is preferably used as the copper oxide. The "divalent copper oxide" is copper oxide in which a valence of copper is divalent ($Cu^{2+}$), and includes copper(II) oxide, copper(II) hydroxide, and a mixture thereof. The copper oxide may properly include impurities such as other metals, metallic compounds, and nonmetallic compounds.

As the reducing agent, those having strong reducing power is preferably used so that no monovalent copper oxide may be produced and/or remain during the reduction reaction. Examples thereof include hydrazine based reducing agents containing hydrazine or a hydrazine compound such as hydrazine hydrochloride, hydrazine sulfate, and hydrazine hydrate; sodium borohydride, sodium sulfite, sodium hydrogensulfite, sodium thiosulfate, sodium nitrite, sodium hyponitrate, phosphorous acid and its salts such as sodium phosphite; and hypophosphorous acid and its salts such as sodium hypophosphite. One of these may be used, or two or more thereof may be used. Particularly, the hydrazine based reducing agents have strong reducing power, and are preferable. The amount of the reducing agent to be used can be properly set as long as it is an amount by which the copper particulates can be produced from the copper oxide. The amount thereof is preferably in the range of 0.2 to 5 mol based on 1 mol of copper contained in the copper oxide. In the case where the amount of the reducing agent is smaller than that in the range, the reaction is hard to progress so that the copper particulates are not sufficiently produced. In the case where the amount of the reducing agent is larger than that in the range, the reaction excessively progresses so that desired copper particulates are hard to be obtained. For this reason, both cases are not preferable. A more preferably amount of the reducing agent to be used is in the range of 0.3 to 2 mol.

The water-based solvent is a solvent containing water. Examples thereof include water or a mixed solvent of water and an organic solvent such as alcohol. Industrially, an aqueous medium is preferably used. The reaction temperature is preferably in the range of 10° C. to the boiling point of a used medium because the reaction easily progresses. The range of 40 to 95° C. is more preferable because fine metallic copper particulates are obtained. The range of 60 to 95° C. is still more preferable, and the range of 80 to 95° C. is particularly preferable. It is preferable that the pH of the reaction solution be adjusted in the range of 3 to 12 in advance with an acid or an alkali, because sedimentation of the copper oxide can be prevented so that the copper oxide can be uniformly reacted. The reaction time can be set by controlling a time to add a raw material such as the reducing agent and the like. For example, approximately 10 minutes to 6 hours are appropriate.

At a time of reduction, a complexing agent can also be used when necessary. It is thought that the complexing agent used when necessary acts in a process in which copper ions are eluted from the copper oxide, or in a process in which copper oxide is reduced to produce metallic copper. The complexing agent means a compound having a donor atom of a ligand and the complexing agent can be bonded to a copper ion or metallic copper to form a copper complex compound. Examples of the donor atom include nitrogen, oxygen, and sulfur. Specifically, (1) examples of the complexing agent having nitrogen as the donor atom include (a) amines (for example, primary amines such as butylamine, ethylamine, propylamine, and ethylenediamine; secondary amines such as dibutylamine, diethylamine, dipropylamine and imines such as piperidine and pyrrolidine; tertiary amines such as tributylamine, triethylamine, and tripropylamine; and those having two or more of primary to tertiary amines in one molecule of diethylenetriamine or triethylenetetramine); (b) nitrogen-containing heterocyclic compounds (for example, imidazole, pyridine, and bipyridine); (c) nitriles (for example, acetonitrile, and benzonitrile) and cyanides; (d) ammonia and ammonium compounds (for example, ammonium chloride, and ammonium sulfate); and (e) oximes.

(2) Examples of the complexing agent having oxygen as the donor atom include (a) carboxylic acids (for example, oxycarboxylic acids such as citric acid, malic acid, tartaric acid, and lactic acid; monocarboxylic acids such as acetic acid and formic acid; dicarboxylic acids such as oxalic acid and malonic acid; and aromatic carboxylic acids such as benzoic acid); (b) ketones (for example, monoketones such as acetone, and diketones such as acetylacetone and benzoylacetone); (c) aldehydes; (d) alcohols such as monohydric alcohol, glycols, and glycerols; (e) quinones; (f) ethers; (g) phosphoric acid (orthophosphoric acid) and phosphoric acid based compounds (for example, hexametaphosphoric acid, pyrophosphoric acid, phosphorous acid, and hypophosphorous acid); and (h) sulfonic acid or sulfonic acid based compounds.

(3) Examples of the complexing agent having sulfur as the donor atom include (a) aliphatic thiols (for example, methyl mercaptan, ethyl mercaptan, propyl mercaptan, isopropyl mercaptan, n-butyl mercaptan, allyl mercaptan, and dimethyl mercaptan); (b) alicyclic thiols (e.g., cyclohexyl thiol); (c) aromatic thiols (e.g., thiophenol); (d) thioketones; (e) thioethers; (f) polythiols; (g) thiocarbonic acids (trithiocarbonic acids); (h) sulfur-containing heterocyclic compounds (for example, dithiol, thiophene, and thiopyran); (i) thiocyanates and isothiocyanates; and (j) inorganic sulfur compounds (for example, sodium sulfide, potassium sulfide, and hydrogen sulfide).

(4) Examples of the complexing agent having two or more of donor atoms include (a) amino acids (the donor atoms are nitrogen and oxygen: for example, neutral amino acids such as glycine and alanine; basic amino acids such as histidine and arginine; and acidic amino acids such as aspartic acid and glutamic acid); (b) amino polycarboxylic acids (the donor atoms are nitrogen and oxygen: for example, ethylenediaminetetraacetate (EDTA), nitrilotriacetate (NTA), iminodiacetate (IDA), ethylenediaminediacetate (EDDA), ethyleneglycoldiethyletherdiaminetetraacetate (GEDA)); (c) alkanolamines (the donor atoms are nitrogen and oxygen: for example, ethanolamine, diethanolamine, and triethanolamine); (d) nitroso compounds and nitrosyl compounds (the donor atoms are nitrogen and oxygen); (e) mercaptocarboxylic acids (the donors are sulfur and oxygen: for example, mercaptopropionic acid, mercaptoacetic acid, thiodipropionic acid, mercaptosuccinic acid, dimercaptosuccinic acid, thioacetic acid, and thiodiglycolic acid); (f) thioglycols (the donors are sulfur and oxygen: for example, mercaptoethanol, and thiodiethylene glycol); (g) thionic acids (the donors are sulfur and oxygen); (h) thiocarbonic acids (the donor atoms are sulfur and oxygen: for example, monothiocarbonic acid, dithiocarbonic acid, and thione carbonic acid); (i) amino thiols (the donors are sulfur and nitrogen: e.g., aminoethylmercaptan, and thiodiethylamine); (j) thioamides (the donor atoms are sulfur and nitrogen: for example, thioformamide); (k) thioureas (the donor atoms are sulfur and nitrogen); (l) thiazoles (the donor atoms are sulfur and nitrogen: for example, thiazole, and benzothiazole); and (m) sulfur-containing amino acids (the donors are sulfur, nitrogen and oxygen: e.g., cysteine, and methionine).

(5) Examples of salts of the above compounds and derivatives thereof include alkali metal salts thereof such as trisodium citrate, potassium sodium tartrate, sodium hypophosphite, and disodium ethylenediaminetetraacetate; and esters of a carboxylic acid, phosphoric acid, and sulfonic acid.

Of these complexing agents, at least one thereof can be used. The optimum amount of the complexing agent varies with a kind of the complexing agent, and the amount of the complexing agent to be used is properly set according to the kind thereof. By reducing the amount of the complexing agent to be used, primary particles of the metal particulates can be made smaller. By increasing the amount of the complexing agent to be used, primary particles thereof can be made larger.

In the present invention, the complexing agent containing at least one selected from nitrogen and oxygen as the donor atom is preferable because the effect of the present invention is easily obtained. Specifically, at least one complexing agent selected from amines, nitrogen-containing heterocyclic compounds, nitriles, cyanides, carboxylic acids, ketones, phosphoric acid and phosphoric acid compounds, amino acids, aminopolycarboxylic acids, alkanolamines, salts thereof, or derivatives thereof is more preferable. Of carboxylic acids, oxycarboxylic acids are preferable. Of ketones, diketones are preferable. Of amino acids, basic and acidic amino acids are preferable. Further, at least one complexing agent selected from butylamine, ethylamine, propylamine, dibutylamine, diethylamine, dipropylamine, tributylamine, triethylamine, tripropylamine, imidazole, citric acid or alkali metal salts thereof, acetylacetone, hypophosphorous acid or alkali metal salts thereof, histidine, arginine, ethylenediaminetetraacetate or alkali metal salts thereof, ethanolamine, and acetonitrile is preferable. As mentioned above, the amount of the oxygen based or nitrogen based complexing agent to be used is preferably in the range of 0.01 to 200 parts by weight based on 1000 parts by weight of the copper oxide, more preferably in the range of 0.1 to 200 parts by weight, and still more preferably in the range of 0.5 to 150 parts by weight.

In the present invention, production of finer copper particulates is more easily controlled by using a complexing agent in which at least one of the donor atoms is sulfur, and using the complexing agent in the range of 0.01 to 2 parts by weight based on 1000 parts by weight of the copper oxide. Examples of the complexing agent containing sulfur include the mercaptocarboxylic acids, thioglycols, sulfur-containing amino acids, aliphatic thiols, alicyclic thiols, aromatic thiols, thioketones, thioethers, polythiols, thiocarbonic acids, sulfur-containing heterocyclic compounds, thiocyanates, isothiocyanates, inorganic sulfur compounds, thionic acids, amino thiols, thioamides, thioureas, and thiazoles, salts thereof, or derivatives thereof. Of these, thioglycols such as mercaptocarboxylic acids and mercaptoethanol, and sulfur-containing amino acid are preferable for their high effect. The molecular weight is more preferably not more than 200, and still more preferably not more than 180. Examples of such a mercaptocarboxylic acid include mercaptopropionic acid (molecular weight of 106), mercaptoacetic acid (molecular weight of 92), thiodipropionic acid (molecular weight of 178), mercaptosuccinic acid (molecular weight of 149), dimercaptosuccinic acid (molecular weight of 180), thiodiglycolic acid (molecular weight of 150), and cysteine (molecular weight of 121). One or more selected from these can be used. A more preferable amount of a mercaptocarboxylic acid to be used is in the range of 0.05 to 1 part by weight, and still more preferably not less than 0.05 parts by weight and less than 0.5 parts by weight.

In the present invention, order to add each raw material at the time of mixing the copper oxide and the reducing agent is not limited. Examples thereof include (1) a method for concurrently adding the copper oxide and the reducing agent to the water-based solvent containing the gelatin, and (2) a method for adding the reducing agent to the water-based solvent containing the gelatin and the copper oxide. Alternatively, the complexing agent may be added at the time of reduction. In this case, examples thereof include (3) a method for concurrently adding the complexing agent and the reducing agent to the water-based solvent containing the gelatin and the copper oxide, and (4) a method for adding a mixed solution of the complexing agent and the reducing agent to the water-based solvent containing the gelatin and the copper oxide. Of these, the methods (3) and (4) are preferable because the reaction is easily controlled. The method (4) is particularly preferable. The copper oxide, the reducing agent, the gelatin, and the complexing agent may be suspended or dissolved in the water-based solvent in advance before these are used in the reduction reaction, and used. "Concurrent addition" means a method for separately adding the copper oxide and the reducing agent, or the complexing agent and the reducing agent around the same period of time during the reaction, and includes continuous addition of both materials during the reaction, and also intermittent addition of one or both materials.

After the metallic copper particles having the gelatin on the surface thereof are produced by the above method, the metallic copper particles are subjected to solid-liquid separation, and washed to obtain a solid of the metallic copper particles. Means for performing solid-liquid separation is not particularly limited, and means such as gravity filtration, pressure filtration, vacuum filtration, suction filtration, centrifugal filtration, and natural sedimentation can be used. Industrially, pressure filtration, vacuum filtration, and suction filtration are preferable. A filter such as a filter press and a roll press is preferably used because the filter has high dehydration ability and can treat a large amount. Next, the solid of the metallic copper particles may be dried by an ordinary method when necessary. The metallic copper particles are easily oxidized. Accordingly, in order to suppress oxidization, drying is preferably performed under an atmosphere of an inert gas such as nitrogen and argon. After drying, the metallic copper particles may be ground when necessary.

Next, when the solid or dried product of the metallic copper particles is mixed and dispersed in the organic solvent, it is important that the polymer dispersing agent having the difference between the amine value and the acid value (amine value–acid value) of 0 to 50 is used. As the organic solvent and the polymer dispersing agent, those mentioned above can be used. A wet type mixer is used for mixing. For example, fixed type mixers such as stirrers, spiral type mixers, ribbon type mixers, and fluidizing type mixers, rotary type mixers such as cylindrical mixers and twin cylindrical mixers, wet grinding mills such as sand mills, ball mills, bead mills, and colloid mills, shakers such as paint shakers, and dispersion machines such as ultrasonic dispersion machines can be used. Thus, a metallic copper dispersion in which the metallic copper particles are dispersed in the organic solvent is obtained. Before mixing, the metallic copper particles may be ground when necessary using a grinding mill such as a compression grinding type mill, an impact compression grinding type mill, a shearing grinding type mill, and a friction grinding type mill. Alternatively, the metallic copper particles may be mixed at the same time when the metallic copper particles are ground.

Next, a metallic copper-containing film for an electrode and a wiring pattern, and a design and decorative coating film and the like using the metallic copper dispersion according to the present invention will be described. The metallic copper-containing film is a film in which metallic copper is fixed onto a base material. A metallic copper-containing film having more firmly fixed metallic copper particles can be obtained by adding a curable resin to the dispersion. By applying heat to the coating film or irradiating the coating film with a laser beam, the metallic copper particles are molten and bonded, and can be fixed still more firmly. In such a metallic copper-containing film, the thickness, size, shape, and the like are not limited. The film thickness may be thin or thick, and the whole surface of the base material or a part thereof may be covered with the metallic copper-containing film. Alternatively, the metallic copper-containing film may have a fine line shape formed on a part of the base material, a broad line shape, or a fine dot shape. As specific application, the metallic copper-containing film can be used for an electrode and a wiring pattern by making use of conductivity of metallic copper, and can also be used for decoration application and antibacterial application by making use of a metal tone and antimicrobial action of metallic copper.

A decorative article and an antimicrobial article according to the present invention are obtained by forming the metallic copper-containing film on at least a part of the surface of a base material. A metal tone or antibacterial properties of the metallic copper particles are given to the surface of the base material. The whole surface of the base material can be colored to give a metal tone or antibacterial properties. In addition, design, a mark, and a logo mark can be formed on a part of the surface of the base material, or other characters, figures, and symbols can also be formed. As the base material, inorganic materials such as metal, glass, ceramics, rock, and concrete, organic materials such as rubber, plastics, paper, wood, leather, fabric, and fiber, and a material in combination with or compounded with an inorganic material and an organic material can be used. Antibacterial properties can also be given by decorating such base materials made of the above materials by forming the metallic copper-containing film on a raw material base material before processing the base material into an article to be used. Alternatively, antibacterial properties can also be given by decorating all articles after processing the base material. Giving antibacterial properties also includes decoration of the surface of an article coated in advance on the surface of those base materials.

Specific examples of an article decorated or given antibacterial properties include:

(1) exterior and interior of transportation such as automobiles, tracks, and buses, a bumper, a doorknob, a rearview mirror, a front grille, a reflecting plate of a lamp, a display instrument, and the like;
(2) exterior of electric appliances such as a television set, a refrigerator, a microwave oven, a personal computer, a mobile phone, and a camera, a remote control, a touch panel, a front panel, and the like;
(3) exterior of buildings such as houses, buildings, department stores, stores, shopping malls, pachinko parlors, wedding halls, funeral halls, shrines, and temples, window glass, a door, a doorplate, a gate, a door, a doorknob, a show window, interior, and the like;
(4) house facilities such as lighting equipment, furniture, furnishings, toilet equipment, Buddhist altars and fittings, a Buddha statue, and the like.
(5) utensil such as hardware and tableware;
(6) vending machines of beverage and tobacco;
(7) containers for synthetic detergents, skin care products, soft drinks, alcoholic beverage, confectionery, food products, tobacco, and pharmaceuticals;
(8) packing materials such as wrapping paper and a carton box;
(9) outfits and accessories such as clothes, shoes, bags, glasses, artificial nails, artificial hair, and jewels;
(10) sporting goods such as a baseball bat, and a golf club, and products for hobbies such as fishing tools;
(11) stationery such as pencils, colored paper, notebooks, and postcards for New Year's greetings, and business equipment such as desks and chairs; and
(12) covers and bands for books, toys such as dolls and small toy cars, cards such as a commuter pass, and recording media such as CDs and DVDs. Human nails, skin, eyebrows, hair, and the like can be used as a base material.

Next, the present invention is a method for producing a metallic copper-containing film wherein the metallic copper dispersion is used. A step (a) in the production process according to the present invention is a step of adhering the metallic copper dispersion onto the surface of the base material. A step (b) is a step of consisting of a step (b1) of heating the metallic copper-containing film produced at the step (a) under a gaseous oxygen-containing atmosphere, and a step (b2) of heating the metallic copper-containing film under a reducing gas atmosphere. A step (c) is a step of irradiating the whole or partial region of the metallic copper-containing film with a laser beam after the step (a). A step (d) is a step of removing the metallic copper-containing film in the region not irradiated with the laser after the step (c). A step (e) is a step of transferring the metallic copper-containing film obtained through the steps (a) to (d) onto other base material. The metallic copper-containing film can also be produced at the step (a), and the subsequent steps (b) to (e) are a step performed when necessary. A firm metallic copper-containing film can be produced by performing one of the steps (b) to (d). The metallic copper-containing film can be simply produced on a base material on which the metallic copper-containing film is difficult to be formed directly by performing the step (e). In the case where an electrode and a wiring pattern are produced, after the step (a), it is possible to perform any combination of steps (b) to (e). More preferably, the step (a) is performed by ink jet printing.

Each step will be described below.

Step (a)

The metallic copper dispersion according to the present invention is adhered to the base material (hereinafter, expressed by "applied"). For application of the metallic copper dispersion, for example general-purpose printing and transfer methods such as screen printing, gravure printing, flexographic printing, ink jet printing, or offset printing, and general-purpose coating methods using a spray, a slit coater, a curtain coater, a bar coater, a brush, a pen brush, or a spin coater can be used. The thickness of the coated layer is not particularly limited, and can be selected properly according to the purpose of use and application. However, a thickness of 0.001 to 100 μm is preferable, and a thickness of 0.005 to 70 μm is more preferable. As an application pattern at this time, the metallic copper dispersion can be applied onto the whole surface of the base material, or can be applied in patterns or in figuratus. According to the coating method, the purpose of use, and application, the particle size of the metallic copper particles, the kinds of the polymer dispersing agent, the organic solvent, and other compounds can be selected properly. Similarly, viscosity of the dispersion and the concentration of metallic copper can be selected properly.

The metallic copper dispersion according to the present invention has characteristics of a low viscosity and a high concentration of copper, and therefore can be used particularly suitably for ink jet printing, spray coating, and the like. Ink jet printing is a method for forming a pattern of a predetermined shape by discharging droplets of the dispersion from fine nozzle to impact the droplets on the base material. By use of this method, a computer such as a personal computer is connected to an ink jet printer, and a relative position of a nozzle as an outlet of the metallic copper dispersion and the base material is changed according to graphic information inputted into the computer so that the dispersion can be discharged to an arbitrary place. Thereby, a desired pattern can be drawn on the base material. Moreover, the thickness and width of the metallic copper-containing film to be formed can be adjusted by a diameter of the nozzle, the amount of the dispersion to be discharged, and a relative relationship among a moving speed of the nozzle and that of the base material on which a discharged substance is formed. For this reason, a fine metallic copper-containing film can be produced. A metallic copper-containing film can be formed at a desired place by accurate discharge even on a base material having a large area whose one side exceeds 1 to 2 m. Yield can be improved because disalignment with adjacent film patterns does not occur. Loss of the metallic copper dispersion can be reduced because the dispersion can be applied only to a necessary portion. There are various types in ink jet printing according to a method of discharging the metallic copper dispersion. For example, there are a piezoelectric element type, a bubble jet type, an air stream type, an electrostatic induction type, an acoustic ink print type, an electrorheological ink type, and an continuous jet type. The type of ink jet printing can be selected properly according to a shape and thickness of the pattern, the kind of the metallic copper dispersion, and the like.

In ink jet printing, the viscosity of the metallic copper dispersion is preferably not more than 100 mPa·s, and much more suitably 1 to 20 mPa·s. This is because the above-mentioned outlet nozzle can discharge the dispersion smoothly without clogging. While the particle size of the metallic copper particles depends on the diameter of the nozzle, a desired pattern shape, and the like, the particle size of 1 to 200 nm is preferable in order to prevent the nozzle from clogging or produce a highly minute pattern, and that of 1 to 100 nm is more preferable.

As the base material, glasses such as alkali-free glass, quartz glass, crystallized clear glass, Pyrex (registered trademark) glass, and sapphire glass; inorganic materials such as $Al_2O_3$, MgO, BeO, $ZrO_2$, $Y_2O_3$, CaO, and GGG (gadolinium gallium garnet); acrylic resins such as PET (polyethylene terephthalate), PEN (polyethylene naphthalate), polypropylene, polycarbonate, and polymethylmethacrylate; vinyl chloride resins such as polyvinyl chloride and vinyl chloride copolymers; organic materials such as epoxy resins, polyarylates, polysulfones, polyethersulfones, polyimides, fluororesins, phenoxy resins, polyolefin resins, nylons, styrene resins, and ABS plastics; and a substrate formed by using a composite material on which inorganic particles having a diameter of several nanometers are dispersed on the organic material; a silicon wafer; and a metal plate, and the like can be used. According to application, the base material can be properly selected from these materials, and used as a flexible base material in a film form or a rigid base material. The size of the base material is not limited. The shape thereof may be any shape such as a disc shape, a card shape, and a sheet-like shape. The surface of the base material does not need to be planar, and may have depressions and projections, or may have a curved surface.

On the base material, a foundation layer may be provided in order to improve planarity of the surface of the base material and adhesive strength, and prevent the metallic copper-containing film from being deteriorated. Examples of materials for the foundation layer include polymer materials such as polymethylmethacrylate, acrylic acid and methacrylic acid copolymers, styrene and maleic anhydride copolymers, polyvinyl alcohols, N-methylolacrylamide, styrene and vinyltoluene copolymers, chlorosulfonated polyethylene, nitrocellulose, polyvinyl chloride, polyvinylidene chloride, chlorinated polyolefins, polyesters, polyimides, vinyl acetate and vinyl chloride copolymers, ethylene and vinyl acetate copolymers, polyethylenes, polypropylenes, and polycarbonates; thermosetting resins, photocurable or electron beam curable resins; and surface modifiers such as coupling materials. As the material of the foundation layer, materials having high adhesion of the base material to the metallic copper-containing film are preferable. Specifically, thermosetting resins, photocurable or electron beam curable resins, and surface modifiers such as coupling agents (for example, a silane coupling agent, a titanate coupling agent, a germanium coupling agent, and an aluminum coupling agent), colloidal silica, and the like are preferable.

The foundation layer can be formed by dissolving or dispersing the above material in an appropriate solvent to prepare a coating liquid, applying the coating liquid onto the surface of the base material using a coating method such as spin coating, dip coating, extrusion coating, and bar coating. Usually, the layer thickness (at the drying) of the foundation layer is preferably 0.001 to 20 μm, and more preferably 0.005 to 10 μm.

When necessary, a film after the metallic copper dispersion is applied thereto may be heated at an appropriate temperature to evaporate and remove (hereinafter, expressed as "drying by heating") the organic solvent (depending on the kind thereof, other low-boiling point compound is included) in the metallic copper-containing film. The temperature for drying by heating can be set properly. In order to suppress oxidization of metallic copper, the temperature of not more than 150° C. is preferable, and that of not more than 120° C. is more preferable. The heating time can also be set properly. An atmosphere can also be set properly, and heating can also be performed under an inert gas atmosphere, a reducing gas atmosphere, or a gaseous oxygen-containing atmosphere (in the air, or the like). $N_2$ gas, Ar gas, He gas, and the like can be used as an inert gas. Evaporation and removal of the organic solvent or the like is not limited to drying by heating, and an air-drying method and a reduced pressure drying method may be used. In the case of reduced pressure drying, it is performed under pressure lower than atmospheric pressure. Specifically, reduced pressure drying may be performed under vacuum pressure and ultra-vacuum pressure.

Step (b1)

After the step (a), the metallic copper-containing film is heated at an appropriate temperature when necessary. By heating, organic compounds contained in the metallic copper-containing films such as the gelatin and the polymer dispersing agent can be decomposed and/or vaporized (hereinafter, expressed as "heating oxidization burning"). The heating is preferably performed under an oxygen-containing atmosphere in order to accelerate decomposition and/or vaporization of the organic compounds, and more preferably in an oxygen-containing gas stream. The concentration of oxygen in the atmosphere is preferably 10 to 10000 ppm because oxidization of the metallic copper particles does not progress so fast. The temperature of heating oxidization burning can be properly set according to a kind of the base material or the like. The temperature of 100 to 500° C. is preferable, and that of 120 to 300° C. is more preferable. The heating time can also be set properly, and that of approximately 10 minutes to 48 hours is appropriate, for example.

Step (b2)

A copper-containing film is heated at an appropriate temperature under a reducing gas atmosphere (hereinafter, expressed as "heating reduction burning"). The atmosphere is desirably in a reducing gas stream. At the step, a reduction reaction of copper oxide formed at the step such as (b1) or the like to metallic copper is performed, and the metallic copper particles are fused. This is because the metal particulates of nano size as those in the present invention have the melting point lower than that of a bulk because of a size effect, and are molten even in a relatively low temperature range. Thereby, electric resistance can be remarkably reduced and a metal tone can be improved through the step in a short time. For example, $H_2$ gas, CO gas, and the like can be used for a reducing gas. $N_2$ gas containing approximately 0.1 to 5% of $H_2$ gas is preferable for safety and availability. The heating temperature can be properly set according to a kind of the base material, or the like. The heating temperature of 100 to 500° C. is preferable, and that of 120 to 300° C. is more preferable. A temperature of the heating temperature at the step (b1) to 300° C. is still more preferable. The heating time can also be set properly, and that of approximately 10 minutes to 48 hours is appropriate, for example. By this heating step, a volume resistivity value of the obtained metallic copper-containing film can be set at order of not more than $10^{-5}$ Ω·cm.

The step of evaporating and removing the organic solvent performed when necessary, the heating oxidization burning step (b1), and the heating reduction burning step (b2) may be performed separately, or may be performed continuously. Moreover, it is not limited to the case of performing the heating oxidization burning step (b1) after the drying by heating step. The heating oxidization burning step (b1) can be performed after air drying or reduced pressure drying is performed without performing drying by heating, or the organic solvent can be evaporated and removed at the heating oxidization burning step (b1), which also serves as the drying by heating step. These steps do not need to be distinguished clearly.

Step (c)

The whole or partial region of the metallic copper-containing film produced at the step (a) is irradiated with a laser beam. A laser beam oscillated by a laser oscillator is converged by a lens, and a diameter of irradiation is set properly. A pattern is drawn on the base material by moving a laser mount part or the base material while irradiating the metallic copper-containing film with the laser beam. The laser beam is absorbed by the metallic copper-containing film, and the organic compounds such as the gelatin and the polymer dispersing agent are decomposed and/or vaporized by the heat to be produced, and simultaneously the metallic copper particles are fused. As a result, electric resistance of a portion of the metallic copper-containing film irradiated with the laser can be reduced, and a metal tone thereof can be improved. Because the metal particulates of nano size as those in the present invention have the melting point lower than that of a bulk because of a size effect, the pattern can be drawn with a relatively low energy and at a high speed.

According to kinds and blending amounts of the gelatin, the polymer dispersing agent, the complexing agent and the like to be used, for example, a wavelength of the laser beam can be arbitrarily selected in the range in which the metallic copper-containing film can absorb the laser. Examples of a typical laser include semiconductor lasers using GaN, GaAsAl, and InGaAsP, for example; excimer lasers using ArF, KrF, and XeCl, for example; dye lasers using rhodamine, for example; gas lasers using He—Ne, He—Cd, $CO_2$, and Ar ion, for example; free electron lasers; and solid state lasers such as ruby lasers and Nd: YAG lasers. A higher order harmonic wave such as a second harmonic wave and third harmonic wave of these lasers may also be used. A laser beam at any wavelength in the ultraviolet region, the visible light region, and the infrared region can be used. Further, irradiation of a continuous wave or irradiation of a pulse wave may be used.

Conditions on applied energy such as a diameter of irradiation of the laser beam, a scan speed, and an output can be properly set in the range in which oxidization of metallic copper and ablation and peeling of the metallic copper-containing film do not occur. The diameter of irradiation of the laser can be properly set in accordance with a pattern to be drawn, and that of 10 μm to 5 mm is suitable. The scan speed can also be properly set according to other parameters, required accuracy, manufacturing capacity, and the like.

An atmosphere under which irradiation with the laser beam is performed, such as an inert gas atmosphere, a reducing gas atmosphere, a gaseous oxygen-containing atmosphere (air atmosphere), can be set properly. By using the metallic copper dispersion according to the present invention, a metallic copper-containing film having low resistance and a good metal tone can be formed without copper in the metallic copper-containing film being oxidized even under the gaseous oxygen-containing atmosphere (air atmosphere), which is conjectured that it is attributed to presence of the gelatin. Specifically, this can be attained by irradiation with a continuous wave laser beam having a wavelength in the infrared region at a scan speed of 1 to 500 mm/s at an output range of 1 to 140 W under the gaseous oxygen-containing atmosphere (air atmosphere). At this time, conditions on laser irradiation are adjusted so that main peak strength in a $Cu_2O$ (111) plane may be not more than 20 when main peak strength in a metallic copper (111) plane is 100 in X-ray diffraction of the metallic copper-containing film at a portion irradiated with the laser beam. An output of the laser beam is more preferably 10 to 100 W, and still more preferably in the range of 20 to 50 W. The semiconductor lasers are preferable because the semiconductor lasers are usually suitable for irradiation with a continuous laser beam having a wavelength in the infrared region.

Further, by setting the irradiation conditions in which a relationship in Expression 1 is satisfied, a thermal effect on the base material can be smaller. The irradiation conditions are more preferable because even in the case where a plastic such as polyimide, PET, and PEN, which is a particularly low heat-resistant base material, is used, the plastic is not easily decomposed.

$$0.5 \leq 100 \ W/(T \cdot S \cdot V) \leq 2.5 \qquad \text{(Expression 1)}$$

wherein T is a heat-resistant temperature of the base material (K), W is an output of the laser (W), S is a diameter of irradiation of the laser (cm), and V is a scan speed of the laser (cm/s).

The heat-resistant temperature of the base material denotes heat resistance of the base material, and is a temperature at which the base material changes. Although the heat-resistant temperature changes with a kind of the base material, a monomer that forms the base material in the case where the base material is an organic substance, and the like, the heat-resistant temperature is approximately 400° C. in the case of polyimides, approximately 150° C. in the case of PET, and approximately 180° C. in the case of PEN. This temperature can be checked by measuring exothermic or an endothermic peak by a differential thermal analysis, for example.

Step (d)

An unnecessary portion of the metallic copper-containing film or a portion thereof not irradiated with the laser beam at the step (c) may be removed using an appropriate solvent when necessary. As a solvent, various solvents such as alcohol solvents, glycol ether solvents, and aromatic solvents can be used. The portion can be removed by immersing the base material in such a solvent or wiping off the portion with a fabric or paper dipped in the solvent.

Step (e)

Next, the whole or partial region of the metallic copper-containing film produced on the base material can also be transferred onto other base material after the step (a), the step (b), the step (c), or the step (d).

The steps (b) to (d) after the step (a) can be arbitrarily combined and performed. For example, the step (b) can be performed after the step (a), and the step (c) can further be performed, or the step (c) and the step (d) can be performed after the step (a), and the step (b) can further be performed. Of the step (b), only the step (b1) or only the step (b2) can be combined and performed. For example, the step (c) can be performed after the step (a), and the step (b2) can further be performed.

EXAMPLES

Hereinafter, Examples will be given to describe the present invention more in detail, but the present invention will not be limited to these Examples.

Examples 1 to 16

24 g of industrial copper(II) oxide (made by NC-Tech Co., Ltd., N-120), and 2.8 g of a gelatin (amine value of 23, acid value of 29, and amine value−acid value=−6) as a protective colloid were added to 150 ml of pure water, and mixed. The pH of the mixed solution was adjusted at 11 using 15% aqueous ammonia. Then, the temperature of the mixed solution was raised from room temperature to 90° C. over 20 minutes. After the temperature was raised, a solution prepared by mixing 0.24 g of a 1% 3-mercaptopropionic acid solution as a complexing agent and 80% hydrazine monohydrate to 150 ml of pure water was added to the mixed solution while stirring, and reacted with copper oxide over 1 hour to produce copper particulates coated with the gelatin. Then, the copper particulates were subjected to filtration and washing until a specific conductivity of a filtrate reached not more than 100 μS/cm, and dried over 10 hours at a temperature of 60° C. in an atmosphere of gaseous nitrogen to obtain metallic copper particles coated with the gelatin.

20 g of the metallic copper particles synthesized according to the above method, coated with the gelatin, and having an average particle size of 50 nm, and 20 g of an organic solvent in which a polymer dispersing agent was dissolved (the kind of the used polymer dispersing agent, the acid value and amine value thereof, (amine value−acid value), the amount of the polymer dispersing agent to be added, and the kind of the organic solvent are shown in Tables 1 and 2.) were mixed and suspended, and dispersed by a paint shaker for 1 hour. Thus, metallic copper dispersions (Samples A to U) according to the present invention were obtained. The average particle size of the metallic copper particles was determined by measuring each primary particle size of 1000 particles using an electron micrograph, and calculating the average of 1000 particles.

The acid value and amine value of the gelatin and those of the polymer dispersing agent were measured by a method according to JIS K 7700 or ASTM D2074 mentioned above.

TABLE 1

| Example | Sample | Polymer dispersing agent | Acid value | Amine value | (Amine value − acid value) | Parts by weight based on 100 parts by weight of Cu | Organic solvent |
|---|---|---|---|---|---|---|---|
| 1 | A | DISPERBYK-161 (BYK-Chemie GmbH) | 0 | 11 | 11 | 5 | Butyl carbitol |
| 2 | B | DISPERBYK-162 (BYK-Chemie GmbH) | 0 | 13 | 13 | 5 | Butyl carbitol |
| 3 | C | DISPERBYK-163 (BYK-Chemie GmbH) | 0 | 10 | 10 | 5 | Butyl carbitol |
| 4 | D | DISPERBYK-2163 (BYK-Chemie GmbH) | 0 | 10 | 10 | 2.5 | Butyl carbitol |
| 5 | E | DISPERBYK-2163 (BYK-Chemie GmbH) | 0 | 10 | 10 | 5 | Butyl carbitol |
| 6 | F | DISPERBYK-2000 (BYK-Chemie GmbH) | 0 | 4 | 4 | 5 | Butyl carbitol |
| 7 | G | ED-213 (Kusumoto Chemicals, Ltd.) | 25 | 40 | 15 | 5 | Butyl carbitol |
| 8 | H | DOPA-15BHFS (Kyoeisha Chemical Co., Ltd.) | 0 | 10 | 10 | 5 | Butyl carbitol |
| 9 | I | DOPA-17HF (Kyoeisha Chemical Co., Ltd.) | 0 | 13 | 13 | 5 | Butyl carbitol |
| 10 | J | DOPA-22 (Kyoeisha Chemical Co., Ltd.) | 0 | 17 | 17 | 5 | Butyl carbitol |

TABLE 2

| Example | Sample | Polymer dispersing agent | Acid value | Amine value | (Amine value − acid value) | Parts by weight based on 100 parts by weight of Cu | Organic solvent |
|---|---|---|---|---|---|---|---|
| 11 | K | DISPERBYK-2163 (BYK-Chemie GmbH) | 0 | 10 | 10 | 5 | Toluene |
| 12 | L | ED-212 (Kusumoto Chemicals, Ltd.) | 20 | 40 | 20 | 5 | Toluene |
| 13 | M | DOPA-44 (Kyoeisha Chemical CO., LTD.) | 0 | 8 | 8 | 5 | Toluene |
| 14 | N | DISPERBYK-2163 (BYK-Chemie GmbH) | 0 | 10 | 10 | 1 | Butanol |
| 15 | O | DISPERBYK-2163 (BYK-Chemie GmbH) | 0 | 10 | 10 | 5 | Butanol |
| 16 | P | DISPERBYK-2163 (BYK-Chemie GmbH) | 0 | 10 | 10 | 5 | Propyleneglycol-1-monomethylether-2-acetate |

TABLE 2-continued

| Example | Sample | Polymer dispersing agent | Acid value | Amine value | (Amine value − acid value) | Parts by weight based on 100 parts by weight of Cu | Organic solvent |
|---|---|---|---|---|---|---|---|
| 17 | Q | DISPERBYK-2164 (BYK-Chemie GmbH) | 0 | 14 | 14 | 5 | Propyleneglycol-1-monomethylether-2-acetate |
| 18 | R | DOPA-33 (Kyoeisha Chemical CO., LTD.) | 0 | 13 | 13 | 5 | Propyleneglycol-1-monomethylether-2-acetate |
| 19 | S | ED-213 (Kusumoto Chemicals, Ltd.) | 25 | 40 | 15 | 5 | Butyl cellosolve |
| 20 | T | ED-213 (Kusumoto Chemicals, Ltd.) | 25 | 40 | 15 | 10 | Butyl cellosolve |
| 21 | U | DISPERBYK-140 (BYK-Chemie GmbH) | 73 | 76 | 3 | 10 | Tetradecane |

Comparative Examples 1 to 2

20 g of metallic copper particles (50 nm) not coated with the gelatin, and 20 g of an organic solvent in which a polymer dispersing agent was dissolved (the kind of the used polymer dispersing agent, the acid value and amine value thereof, (amine value−acid value), the amount of the polymer dispersing agent to be added, and the kind of the organic solvent are shown in Table 3.) were mixed and suspended, and dispersed by a paint shaker for 1 hour. Thus, metallic copper dispersions (Samples V and W) were obtained.

TABLE 3

| Comparative Example | Sample | Polymer dispersing agent | Acid value | Amine value | (Amine value − acid value) | Parts by weight based on 100 parts by weight of Cu | Organic solvent |
|---|---|---|---|---|---|---|---|
| 1 | V | DISPERBYK-161 (BYK-Cheniie GmbH) | 0 | 11 | 11 | 5 | Butyl carbitol |
| 2 | W | DISPERBYK-2000 (BYK-Chemie GmbH) | 0 | 4 | 4 | 5 | Butyl carbitol |

Comparative Examples 3 to 5

20 g of the metallic copper particles (50 nm) coated with the gelatin used in Example 1, and 20 g of an organic solvent in which a polymer dispersing agent was dissolved (the kind of the used polymer dispersing agent, the acid value and amine value thereof, (amine value−acid value), the amount of the polymer dispersing agent to be added, and the kind of the organic solvent are shown in Table 4.) were mixed and suspended, and dispersed by a paint shaker for 1 hour. Thus, metallic copper dispersions (Samples X to Z) were obtained.

TABLE 4

| Comparative Example | Sample | Polymer dispersing agent | Acid value | Amine value | (Amine value − acid value) | Parts by weight based on 100 parts by weight of Cu | Organic solvent |
|---|---|---|---|---|---|---|---|
| 3 | X | DISPERBYK-111 (BYK-Chemie GmbH) | 0 | 129 | 129 | 5 | Butyl carbitol |
| 4 | Y | ED-350 (Kusumoto Chemicals, Ltd.) | 130 | 0 | −130 | 5 | Butyl cellosolve |
| 5 | Z | ED-360 (Kusumoto Chemicals, Ltd.) | 52 | 42 | −10 | 5 | Toluene |

The concentration of a solid content in a supernatant and the visual appearance of the metallic copper dispersion at an early stage within one week after production of the metallic copper dispersion (Samples A to Z) produced using 50% by weight of the metallic copper particles were evaluated. The concentration of a solid content in a supernatant and the visual appearance of the metallic copper dispersion after one month were also evaluated. Table 5, Table 6, and Table 7 show the results. Dispersion stability is higher as the concentration of the solid content is higher. From this, it turned out that in a metallic copper dispersion whose difference between the amine value and the acid value (amine value–acid value) of the gelatin on the surface of the metallic copper particles is not more than 0 and whose difference between the amine value and the acid value (amine value–acid value) of the polymer dispersing agent is 0 to 50, the metallic copper particles are sufficiently dispersed after one month, and dispersion stability is maintained for a long period of time. Table 5, Table 6, and Table 7 show evaluation of the visual appearance wherein ○: good dispersibility, and x: gelling or not less than 70% of copper particles are sedimented.

Particle size distribution of the metallic copper particles in the metallic copper dispersion was measured using a dynamic light scattering particle size distribution analyzer (Microtrac UPA type: made by Nikkiso Co., Ltd.). Then, it turned out that the metallic copper dispersion according to the present invention has sharp particle size distribution of the blended metallic copper particles, and the median size of the metallic copper particles is in the range of 1 to 200 nm. A solvent type slurry whose concentration was adjusted so that signal intensity of the laser might be 0.1 to 0.2 was used for measurement of this dynamic light scattering particle size distribution.

Moreover, viscosity of the metallic copper dispersion was measured on a condition of 10 rpm using an E type viscometer (made by Toki Sangyo Co., Ltd., RE80L). Then, viscosity of Samples A to G using butyl carbitol in Examples 1 to 7 was 15 mPa·s, that of Samples K and L using toluene in Examples 11 and 12 was 1.8 mPa·s, and that of Samples N and O using butanol in Examples 14 and 15 was 12 mPa·s. Viscosity in other Examples was also not more than 100 mPa·s.

TABLE 5

| Example | Sample | Concentration of solid content in supernatant at early stage (wt %) | Evaluation of visual appearance at early stage | Concentration of solid content of supernatant after one month (wt %) | Visual appearance after one month | Median size at early stage (nm) |
|---|---|---|---|---|---|---|
| 1 | A | 50.5 | ○ | 50.7 | ○ | 180.1 |
| 2 | B | 50.8 | ○ | 46.6 | ○ | 50.2 |
| 3 | C | 50.7 | ○ | 47.2 | ○ | 117.2 |
| 4 | D | 50.7 | ○ | 47.9 | ○ | 55.1 |
| 5 | E | 46.2 | ○ | 46.1 | ○ | 53.4 |
| 6 | F | 50.9 | ○ | 50.8 | ○ | 46.2 |
| 7 | G | 50.2 | ○ | 46.5 | ○ | 68.3 |
| 8 | H | 49.5 | ○ | 46.1 | ○ | 94.0 |
| 9 | I | 50.1 | ○ | 45.5 | ○ | 95.5 |
| 10 | J | 50.0 | ○ | 49.9 | ○ | 75.5 |

TABLE 6

| Example | Sample | Concentration of solid content in supernatant at early stage (wt %) | Evaluation of visual appearance at early stage | Concentration of solid content of supernatant after one month (wt %) | Visual appearance after one month | Median size at early stage (nm) |
|---|---|---|---|---|---|---|
| 11 | K | 50.6 | ○ | 45.3 | ○ | 45.5 |
| 12 | L | 49.8 | ○ | 47.5 | ○ | 35.5 |
| 13 | M | 48.9 | ○ | 48.5 | ○ | 75.5 |
| 14 | N | 49.9 | ○ | 42.4 | ○ | 99.6 |
| 15 | O | 50.6 | ○ | 49.9 | ○ | 95.3 |
| 16 | P | 50.0 | ○ | 48.7 | ○ | 82.9 |
| 17 | Q | 50.0 | ○ | 48.0 | ○ | 75.5 |
| 18 | R | 50.2 | ○ | 49.9 | ○ | 40.5 |
| 19 | S | 48.7 | ○ | 41.2 | ○ | 100.5 |
| 20 | T | 49.9 | ○ | 48.5 | ○ | 75.5 |
| 21 | U | 45.6 | ○ | 40.1 | ○ | 170.5 |

TABLE 7

| Comparative Example | Sample | Concentration of solid content in supernatant at early stage (wt %) | Evaluation of visual appearance at early stage | Concentration of solid content in supernatant after one month (wt %) | Visual appearance after one month | Median size at early stage (nm) |
|---|---|---|---|---|---|---|
| 1 | V | Measurement impossible | x | Measurement impossible | x | Measurement impossible |

TABLE 7-continued

| Comparative Example | Sample | Concentration of solid content in supernatant at early stage (wt %) | Evaluation of visual appearance at early stage | Concentration of solid content in supernatant after one month (wt %) | Visual appearance after one month | Median size at early stage (nm) |
|---|---|---|---|---|---|---|
| 2 | W | Measurement impossible | x | Measurement impossible | x | Measurement impossible |
| 3 | X | 50.2 | ○ | 11.1 | x | 161.5 |
| 4 | Y | 50.0 | ○ | Measurement impossible | x | 111.7 |
| 5 | Z | 36.0 | ○ | Measurement impossible | x | 157.6 |

Example 22

Next, production of the metallic copper-containing film was tried using the metallic copper dispersion produced in Examples above.

First, each sample of the metallic copper dispersions D to G, K, L, N to Q, and S in Examples above was dropped on a polyimide substrate (made by Du Pont-Toray Co., Ltd., a Kapton (registered trademark) film 300V type, thickness of 75 µm), and spread on the base material by a bar coater (#6) so that the metallic copper dispersion might have a uniform thickness (approximately 14 µm). Then, the solvent was vaporized in a gaseous $N_2$ atmosphere by heating the base material for 1 hour at 80° C. to produce a metallic copper containing coating film.

Next, the step (b1) was performed on each sample at a concentration of oxygen and a heating temperature shown in Table 8. Subsequently, the step (b2) was performed on each sample at a temperature shown in Table 8. The step (b2) was performed under a 3% hydrogen containing gaseous nitrogen atmosphere. An electric tubular furnace made by Koyo Thermo System Co., Ltd. (KTF085N) was used for heating. A temperature raising rate and a temperature falling rate were 10° C./min., and the heating time was 1 hour at each step.

The volume resistivity value of each kind of the obtained samples was measured, and a state of the metallic copper-containing film was visually observed. A Loresta-GP type low resistivity meter (made by Mitsubishi Chemical Corporation) was used for measurement of the volume resistivity value. A metal tone was evaluated with respect to an appearance of the metallic copper-containing film. Table 8 shows the result.

It turned out that a metallic copper-containing film having a metal tone and low resistance can be produced by first heating the metallic copper-containing film produced using the metallic copper dispersion according to the present invention under a gaseous oxygen-containing atmosphere, and subsequently under a reducing gas atmosphere. Particularly, it turned out that a metallic copper-containing film having resistivity of the same order as that of bulk metallic copper can be produced even at a relatively low temperature of 200° C., and the metallic copper dispersion according to the present invention can also be used for a base material having heat resistance much lower than that of polyimides.

The volume resistivity value of the metallic copper-containing film after the step (b1) was not less than $10^3$ Ωcm, and its appearance had a color of black, not a metal color.

Example 23

Further, production of the metallic copper-containing film by irradiation with a laser beam was tried.

First, the metallic copper dispersion (Sample L) produced in Example 12 was dropped on a polyimide base material, and spread on the base material by the bar coater (#6) so that the metallic copper dispersion might have a uniform thickness (approximately 14 µm). Then, the solvent was vaporized in a gaseous $N_2$ atmosphere by heating the base material for 1 hour at 80° C. to produce a metallic copper containing coating film.

Next, while the coating film was irradiated with a semiconductor laser in the air to apply energy to the coating film, a stage on which the semiconductor laser was placed was moved to draw a pattern (a laser processing apparatus FD-200 made by Fine Device Co., Ltd. was used). The laser was a continuous wave having a wavelength of 940 nm, and

TABLE 8

| Sample | Heating temperature at step (b1) (° C.) | Oxygen concentration at step (b1) (ppm) | Heating temperature at step (b2) (° C.) | Volume resistivity value (µΩcm) | Color tone |
|---|---|---|---|---|---|
| D | 200 | 1000 | 200 | 23 | Copper color |
| E | 180 | 1000 | 180 | 96 | Copper color |
| F | 180 | 50 | 200 | 35 | Copper color |
| G | 220 | 100 | 250 | 19 | Copper color |
| K | 200 | 1000 | 200 | 5 | Copper color |
| L | 180 | 1000 | 200 | 6 | Copper color |
| N | 150 | 1000 | 200 | 36 | Copper color |
| O | 150 | 10000 | 180 | 63 | Copper color |
| P | 180 | 5000 | 250 | 22 | Copper color |
| Q | 200 | 1000 | 250 | 12 | Copper color |
| S | 200 | 5000 | 300 | 5 | Copper color | a diameter of irradiation thereof was 2.16 mm. An output and a scan speed of the laser were conditions described in Table 9. A wiring width was approximately 0.6 cm in Samples 1 to 3, approximately 0.2 cm in Sample 4, and approximately 1.2 cm in Samples 5 to 8.

Then, in the metallic copper-containing film after irradiated with the laser beam, a metallic copper containing coating film at a portion not irradiated with the laser was wiped off with a nonwoven fabric impregnated with toluene. Thus, a metallic copper-containing film was completed.

Figure 2:
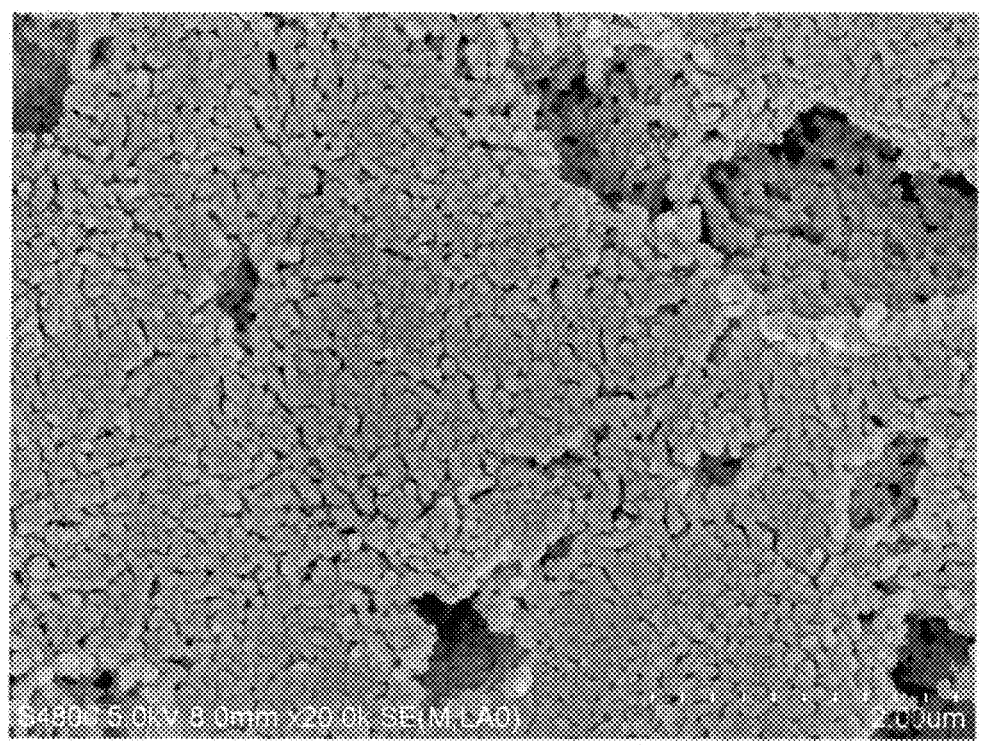
FIG. 2 is an SEM image of the surface of a copper coating film after Sample 1 of Example 23 is irradiated with a laser.

FIG. 1 and FIG. 2 show a scanning electron microscope image of the surface of the coating film in Sample 1 before irradiation with the laser beam and that after irradiation with the laser beam, respectively. The volume resistivity value of each kind of the obtained samples was measured, and states of the metallic copper-containing film and the substrate were visually observed. A metal tone was evaluated with respect to an appearance of the metallic copper-containing film. Table 9 shows the result.

TABLE 9

| Sample | Output (W) | Scan speed (mm/s) | Volume resistivity value ($\mu\Omega$cm) | Color tone |
|---|---|---|---|---|
| 1 | 50 | 200 | 130 | Copper color |
| 2 | 40 | 200 | 110 | Copper color |
| 3 | 30 | 200 | 140 | Copper color |
| 4 | 30 | 100 | 300 | Copper color |
| 5 | 50 | 200 | 23 | Copper color |
| 6 | 40 | 200 | 16 | Copper color |
| 7 | 30 | 200 | 19 | Copper color |
| 8 | 20 | 200 | 650 | Copper color |

Figure 3:
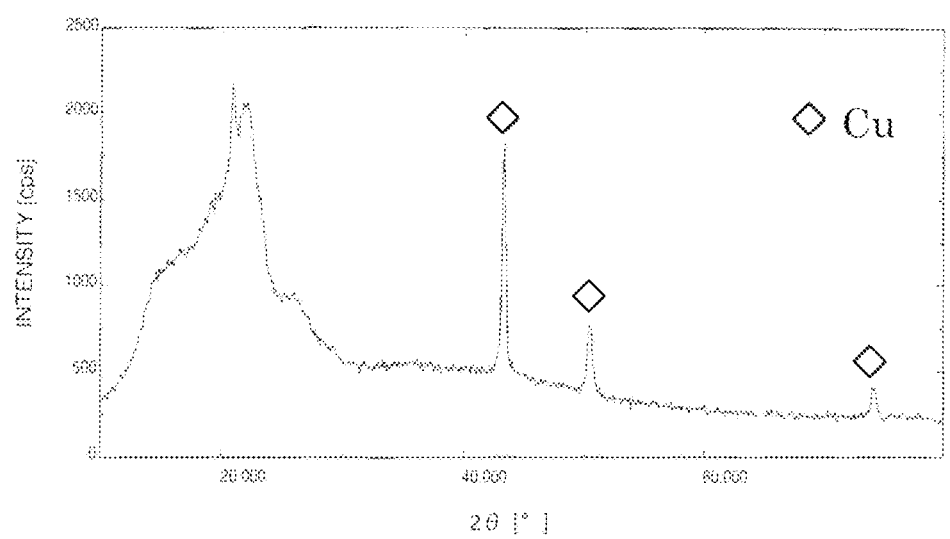
FIG. 3 is an XRD profile of a copper coating film after Sample 5 of Example 23 is irradiated with a laser.

FIG. 3 shows an XRD profile of the coating film in Sample 5. A RINT 2200 X-ray diffractometer (CuK$\alpha$ rays) made by Rigaku Corporation was used for measurement. Recognized diffraction peaks (28) were 43.3°, 50.4°, and 74.1°. The respective peaks are attributed to metallic copper, and copper oxide is not recognized. In short, main peak intensity of the (111) plane of $Cu_2O$ is not more than 20 wherein main peak (43.3°) intensity of the (111) plane of Cu is 100.

It turned out that by irradiating the metallic copper containing coating film produced using the metallic copper dispersion according to the present invention with a laser, copper is not oxidized even if the metallic copper containing coating film is irradiated in the air, and a metallic copper-containing film having a metal tone and low resistance can be produced.

Example 24

Subsequently, the metallic copper containing coating film was irradiated with the laser by the same method as that in Example 23 to form a pattern except that PET (made by Toray Industries, Inc., LUMIRROR (registered trademark) T-60, thickness of 75 μm) was used for the base material. Table 10 shows the result.

TABLE 10

| Sample | Output (W) | Scan speed (mm/s) | Volume resistivity value ($\mu\Omega$cm) | Color tone |
|---|---|---|---|---|
| 9 | 20 | 200 | 420 | Copper color |

It turned out that by using the laser irradiation conditions according to the present invention, the base material does not change even if a low heat-resistance material such as PET is used as the base material, and a metallic copper-containing film having a metal tone and low resistance can be produced.

According to Examples above, it was recognized that by using the metallic copper dispersion according to the present invention, the metallic copper-containing film having a metal tone and low electric resistance can be produced in the case of various base materials, particularly base materials having low heat resistance. It was also recognized that the metallic copper-containing film can be produced similarly by using the dispersion after one month passed. While the case of a linear pattern has been described in the present Examples, the present invention can be performed similarly in the cases other than such a linear pattern, for example, in production of a planar pattern for decoration coating films and the like, and production of a three-dimensional pattern by repeated lamination.

INDUSTRIAL APPLICABILITY

The metallic copper dispersion according to the present invention can maintain dispersion stability of the metallic copper particles in the organic solvent for a long period of time, and maintain dispersion stability after the metallic copper dispersion is prepared until it is used. Accordingly, the metallic copper dispersion according to the present invention has excellent coating suitability, and can be used for a wide range of the coating methods such as ink jet printing and spray coating. According to the purpose of use, a composition of a paint, an ink, a paste, or the like can be arbitrarily designed by blending resin components and the like.

By using the metallic copper dispersion according to the present invention, the metallic copper-containing film can be produced also by heating at a relatively low temperature or irradiation with a laser. The metallic copper-containing film can be widely used for materials in which electrical conduction is ensured, and materials to which antistatic properties, electromagnetic interference shielding properties, a metal tone, antibacterial properties, or the like is given, for example. Particularly, the metallic copper-containing film can also be used for new use in nanotechnology such as formation of an electrode and a circuit wiring pattern actively developed in recent years. The metallic copper-containing film can also be used for application of an alternative to plating techniques, e.g., for providing design and decoration by a metal tone, and antibacterial properties.

The invention claimed is:

1. A process for producing a metallic copper-containing film having a volume resistivity value of $0.5 \times 10^{-5}$ $\Omega$·cm to $9.6 \times 10^{-5}$ $\Omega$·cm, comprising a step (a) and a step (b):

step (a) of applying a metallic copper dispersion comprising at least metallic copper particles having a gelatin on a surface thereof, a polymer dispersing agent, and an organic solvent, onto a surface of a base material, and drying the metallic copper dispersion by heating at a temperature not more than 150° C. to remove the organic solvent and form the metallic copper-containing film adhered to the base material, wherein the base material comprises an organic material, a difference between an amine value and an acid value (amine value–acid value) of the gelatin is not more than 0, and a difference between an amine value and an acid value (amine value–acid value) of the polymer dispersing agent is 0 to 50; and step (b) comprising a step (b1) of heating the metallic copper-containing film produced in step (a) at 100 to 300° C. for 10 minutes to 48 hours under a gaseous oxygen-containing atmosphere having oxygen concentration of 10 to 10000 ppm to decompose or vaporize the gelatin and polymer dispersing agent and remove the gelatin and polymer dispersing agent from the metallic copper-containing film, and a step (b2) of heating a metallic copper-containing film produced in step (b1) under a reducing gas atmosphere at the heating temperature of 100 to 300° C. to reduce any copper oxide formed in the step (b1) to copper and produce the metallic copper-containing film having a volume resistivity value of $0.5 \times 10^{-5}$ Ω·cm to $9.6 \times 10^{-5}$ Ω·cm.

2. The process for producing a metallic copper-containing film according to claim 1, wherein the organic solvent is at least one selected from the group consisting of hydrocarbons, alcohols, ketones, esters, ethers, glycols, glycol esters, and glycol esters.

3. The process for producing a metallic copper-containing film according to claim 1, wherein a blending amount of the polymer dispersing agent is 0.1 to 20 parts by weight based on 100 parts by weight of the metallic copper particles.

4. The process for producing a metallic copper-containing film according to claim 1, wherein a viscosity of the metallic copper dispersion is not more than 100 mPa·s.

5. The process for producing a metallic copper-containing film according to claim 1, wherein a median size of the metallic copper particles is 1 to 200 nm.

6. The process for producing a metallic copper-containing film according to claim 1, wherein a concentration of the metallic copper particles in the metallic copper dispersion is not less than 15% by weight, a median size of the metallic copper particles is 1 to 200 nm, and a viscosity of the metallic copper dispersion is not more than 100 mPa·s.

7. The process for producing a metallic copper-containing film according to claim 1, wherein a difference between an amine value and an acid value (amine value–acid value) of the gelatin is −50 to 0, and the gelatin is an alkali-treated gelatin, and a difference between an amine value and an acid value (amine value–acid value) of the polymer dispersing agent is 0 to 50, and a base site and an acid site of the polymer dispersing agent is electrostatically bonded to an acid site and a base site of the gelatin on the surface of the metallic copper particles.

8. The process for producing a metallic copper-containing film according to claim 7, wherein the metallic copper particles have a median size of 1 to 200 nm;

the organic solvent is selected from the group consisting of hydrocarbons, alcohols, ketones, esters, ethers, glycols, glycol ethers, and glycol esters; and the polymer dispersing agent is present in a ratio of 0.1 to 20 parts by weight based on 100 parts by weight of the metallic copper particles.

9. The process for producing a metallic copper-containing film according to claim 1, wherein the organic material is at least one selected from the group consisting of polyimides, polyethylene terephthalate (PET), and polyethylene naphthalate (PEN).

10. The process for producing a metallic copper-containing film according to claim 1, wherein the base material in Step (a) has a foundation layer thereon and the Step (a) comprises adhering the metallic copper-containing film to the foundation layer so that the metallic copper-containing film is adhered to the base material by the foundation layer.

11. The process for producing a metallic copper-containing film according to claim 1, further comprising using inkjet printing to apply the metallic copper dispersion to the base material.

12. The process for producing a metallic copper-containing film according to claim 1, further comprising heating the metallic copper dispersion at a temperature not more than 120° C. to form the metallic copper-containing film in step (a), heating the metallic copper-containing film produced in step (a) at 100 to 200° C. in step (b1), and heating the metallic copper-containing film produced in step (b1) at 100 to 200° C. in step (b2).

13. A process for producing a metallic copper-containing film having a volume resistivity value of $0.5 \times 10^{-5}$ Ω·cm to $9.6 \times 10^{-5}$ Ω·cm, comprising a step (a) and a step (b):

step (a) of applying a metallic copper dispersion comprising at least metallic copper particles having a gelatin on a surface thereof, a polymer dispersing agent, and an organic solvent, onto a surface of a base material, and drying the metallic copper dispersion by heating at a temperature not more than 150° C. to form the metallic copper-containing film adhered on the base material, wherein the base material comprises an organic material, a difference between an amine value and an acid value (amine value –acid value) of the gelatin is substantially −6, and a difference between an amine value and an acid value (amine value –acid value) of the polymer dispersing agent is 3 to 20; and step (b) comprising:

a step (b1) of heating the metallic copper-containing film produced in step (a) at 100 to 300° C. for 10 minutes to 48 hours under a gaseous oxygen-containing atmosphere having oxygen concentration of 10 to 1000 ppm to decompose or vaporize the gelatin and the polymer dispersing agent and remove the gelatin and the polymer dispersing agent from the metallic copper-containing film, and a step (b2) of heating a metallic copper-containing film produced in step (b1) under a reducing gas atmosphere at the heating temperature of 100 to 300° C. to reduce any copper oxide formed in the step (b1) to copper and produce the metallic copper-containing film having a volume resistivity value of $0.5 \times 10^{-5}$ Ω·cm to $9.6 \times 10^{-5}$ Ω·cm.

14. The process for producing a metallic copper-containing film according to claim 13, wherein the organic material is at least one selected from the group consisting of polyimides, polyethylene terephthalate (PET), and polyethylene naphthalate (PEN).

15. The process for producing a metallic copper-containing film according to claim 13, wherein the base material in Step (a) has a foundation layer thereon and the Step (a) comprises adhering the metallic copper-containing film to the foundation layer so that the metallic copper-containing film is adhered to the base material by the foundation layer.

16. The process for producing a metallic copper-containing film according to claim 13, further comprising using inkjet printing to apply the metallic copper dispersion to the base material.

17. The process for producing a metallic copper-containing film according to claim 13, further comprising heating the metallic copper dispersion at a temperature not more than 120° C. to form the metallic copper-containing film in step (a), heating the metallic copper-containing film produced in step (a) at 100 to 200° C. in step (b1), and heating the metallic copper-containing film produced in step (b1) at 100 to 200° C. in step (b2).

18. A process for producing a metallic copper containing film having a volume resistivity value of $0.5\times10^{-5}$ Ω·cm to $9.6\times10^{-5}$ Ω·cm, comprising a step (a) and a step (b):

step (a) of applying a metallic copper dispersion comprising at least metallic copper particles having a gelatin on a surface thereof, a polymer dispersing agent, and an organic solvent, onto a surface of a base material, and drying the metallic copper dispersion by heating at a temperature not more than 150° C. to remove the organic solvent and form the metallic copper-containing film adhered to the base material, wherein the base material comprises an organic material, a difference between an amine value and an acid value (amine value −acid value) of the gelatin is substantially −6, and a difference between an amine value and an acid value (amine value −acid value) of the polymer dispersing agent is 3 to 20, and the polymer dispersing agent is selected from the group consisting of a salt of a long-chain polyaminoamide and polar acid ester, unsaturated polycarboxylic acid polyaminoamide, a polycarboxylic acid salt of polyaminoamide, a salt of a long-chain polyaminoamide and an acid polymer, and alkyl ammonium salts, amine salts, and amide amine salts of at least one of acrylic polymers, acrylic copolymers, modified polyester acids, polyether ester acids, polyether carboxylic acids, and polycarboxylic acids, and a base site and an acid site of the polymer dispersing agent are electrostatically bonded to an acid site and a base site of the gelatin on the surface of the metallic copper particles; and step (b) comprising a step (b1) of heating the metallic copper-containing film produced in step (a) at 100 to 300° C. for 10 minutes to 48 hours under a gaseous oxygen-containing atmosphere having oxygen concentration of 10 to 10000 ppm to decompose or vaporize the gelatin and the polymer dispersing agent and remove the gelatin and the polymer dispersing agent from the metallic copper-containing film, and a step (b2) of heating a metallic copper-containing film produced in step (b1) under a reducing gas atmosphere at the heating temperature of 100 to 300° C. to reduce any copper oxide formed in the step (b1) to copper and produce the metallic copper-containing film having a volume resistivity value of $0.5\times10^{-5}$ Ω·cm to $9.6\times10^{-5}$ Ω·cm.

19. The process for producing a metallic copper-containing film according to claim 18, wherein the organic material is at least one selected from the group consisting of polyimides, polyethylene terephthalate (PET), and polyethylene naphthalate (PEN).

20. The process for producing a metallic copper-containing film according to claim 18, wherein the base material in Step (a) has a foundation layer thereon and the Step (a) comprises adhering the metallic copper-containing film to the foundation layer so that the metallic copper-containing film is adhered to the base material by the foundation layer.

21. The process for producing a metallic copper-containing film according to claim 18, further comprising using inkjet printing to apply the metallic copper dispersion to the base material.

22. The process for producing a metallic copper-containing film according to claim 18, further comprising heating the metallic copper dispersion at a temperature not more than 120° C. to form the metallic copper-containing film in step (a), heating the metallic copper-containing film produced in step (a) at 100 to 200° C. in step (b1), and heating the metallic copper-containing film produced in step (b1) at 100 to 200° C. in step (b2).

23. A process for producing a metallic copper-containing film having a volume resistivity value of $0.5\times10^{-5}$ Ω·cm to $9.6\times10^{-5}$ Ω·cm, comprising a step (a) and a step (b):

step (a) providing an ink-jet printable metallic copper dispersion having a viscosity and copper concentration suitable for ink jet printing comprising metallic copper particles having a gelatin on a surface thereof, a polymer dispersing agent, and an organic solvent, ink jet printing the metallic copper dispersion onto a base material in a desired pattern, and then drying the metallic copper dispersion by heating the metallic copper dispersion to remove the organic solvent from the metallic copper dispersion to form a metallic copper-containing film adhered on the base material in the desired pattern, the base material comprising an organic material, wherein a difference between an amine value and an acid value (amine value −acid value) of the gelatin is not more than 0, and a difference between an amine value and an acid value (amine value −acid value) of the polymer dispersing agent is 0 to 50; and step (b) comprising a step (b1) of heating the metallic copper-containing film produced in step (a) under a gaseous oxygen-containing atmosphere to decompose or vaporize the gelatin and polymer dispersing agent and remove the gelatin and polymer dispersing agent from the metallic copper-containing film; and a step (b2) of heating a metallic copper-containing film produced in step (b1) under a reducing gas atmosphere to reduce any copper oxide formed in the step (b1) to copper and produce the metallic copper-containing film having a volume resistivity value of $0.5\times10^{-5}$ Ω·cm to $9.6\times10^{-5}$ Ω·cm.

\* \* \* \* \*